United States Patent
Kim et al.

(10) Patent No.: US 10,763,225 B2
(45) Date of Patent: Sep. 1, 2020

(54) ANTENNA MODULE

(71) Applicant: SAMSUNG ELECTRONICS CO., LTD., Suwon-si (KR)

(72) Inventors: Doo Il Kim, Suwon-Si (KR); Yong Ho Baek, Suwon-Si (KR); Jin Seon Park, Suwon-Si (KR); Young Sik Hur, Suwon-Si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 161 days.

(21) Appl. No.: 15/949,439

(22) Filed: Apr. 10, 2018

(65) Prior Publication Data

US 2019/0139912 A1     May 9, 2019

(30) Foreign Application Priority Data

Nov. 3, 2017    (KR) .................... 10-2017-0146112

(51) Int. Cl.
*H01L 23/66*    (2006.01)
*H01L 23/31*    (2006.01)
(Continued)

(52) U.S. Cl.
CPC ........... *H01L 23/66* (2013.01); *H01L 21/486* (2013.01); *H01L 21/4853* (2013.01);
(Continued)

(58) Field of Classification Search
None
See application file for complete search history.

(56) References Cited

U.S. PATENT DOCUMENTS 8,952,521 B2 * 2/2015 Wojnowski ....... H01L 23/49816
                                                        257/675
9,711,465 B2    7/2017 Liao et al.
(Continued)

FOREIGN PATENT DOCUMENTS

JP        2013-105992 A    5/2013
KR    10-2007-0046898 A    5/2007
(Continued)

OTHER PUBLICATIONS

Communication dated May 31, 2019 issued by the Taiwan Intellectual Property Office in counterpart Taiwan Application No. 107113052.
(Continued)

*Primary Examiner* — Mounir S Amer
(74) *Attorney, Agent, or Firm* — Sughrue Mion, PLLC

(57) ABSTRACT

An antenna module includes a fan-out semiconductor package including an IC, an encapsulant encapsulating at least a portion of the IC, a core member having a first side surface facing the IC or the encapsulant, and a connection member including at least one wiring layer electrically connected to the IC and the core member and at least one insulating layer; and an antenna package including a plurality of first directional antenna members configured to transmit or receive a first RF signal. The fan-out semiconductor package further includes at least one second directional antenna member disposed on a second side surface of the core member opposing the first side surface of the core member, stood up from a position electrically connected to at least one wiring layer, and configured to transmit or receive a second RF signal.

20 Claims, 26 Drawing Sheets

(51) Int. Cl.
- *H01L 23/538* (2006.01)
- *H01L 23/00* (2006.01)
- *H01L 21/48* (2006.01)
- *H01L 21/56* (2006.01)
- *H01L 23/552* (2006.01)
- *H01Q 1/22* (2006.01)
- *H01Q 1/52* (2006.01)
- *H01Q 9/04* (2006.01)
- *H01Q 21/06* (2006.01)
- *H01Q 1/24* (2006.01)

(52) U.S. Cl.
CPC ........ *H01L 21/565* (2013.01); *H01L 23/3114* (2013.01); *H01L 23/5384* (2013.01); *H01L 23/5386* (2013.01); *H01L 23/5389* (2013.01); *H01L 23/552* (2013.01); *H01L 24/19* (2013.01); *H01L 24/20* (2013.01); *H01Q 1/2283* (2013.01); *H01Q 1/523* (2013.01); *H01Q 9/0414* (2013.01); *H01Q 21/065* (2013.01); *H01L 23/3128* (2013.01); *H01L 2223/6616* (2013.01); *H01L 2223/6672* (2013.01); *H01L 2223/6677* (2013.01); *H01L 2223/6688* (2013.01); *H01L 2224/04105* (2013.01); *H01L 2224/12105* (2013.01); *H01L 2224/16227* (2013.01); *H01L 2224/214* (2013.01); *H01L 2924/19105* (2013.01); *H01L 2924/3025* (2013.01); *H01Q 1/243* (2013.01)

(56) References Cited

U.S. PATENT DOCUMENTS

| | | | |
|---|---|---|---|
| 9,780,210 B1* | 10/2017 | Goktepeli | H01L 29/0847 |
| 9,831,224 B2* | 11/2017 | Lin | H01L 21/76802 |
| 9,848,500 B2* | 12/2017 | Merkle | H05K 1/185 |
| 2012/0280366 A1 | 11/2012 | Kamgaing et al. | |
| 2017/0222325 A1 | 8/2017 | Sudo | |

FOREIGN PATENT DOCUMENTS

| | | |
|---|---|---|
| KR | 10-2014-0014260 A | 2/2014 |
| WO | 2006/025972 A1 | 3/2006 |

OTHER PUBLICATIONS

Communication dated Jun. 1, 2019 issued by the Korean Intellectual Property Office in counterpart Korean Application No. 10-2017-0146112.

Korean Office Action dated Jan. 17, 2019 issued in Korean Patent Application No. 10-2017-0146112 (with English translation).

* cited by examiner

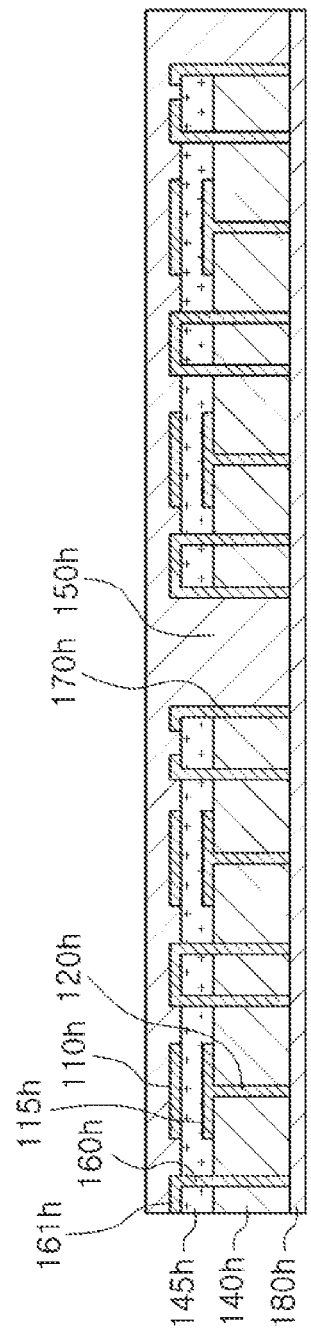

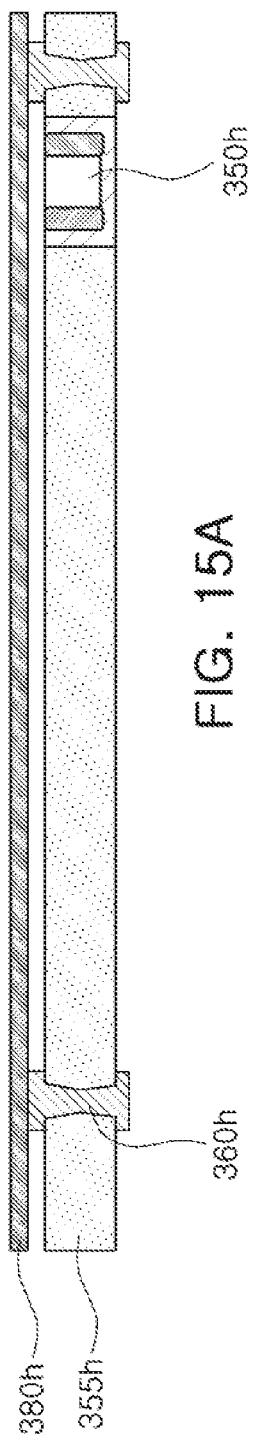
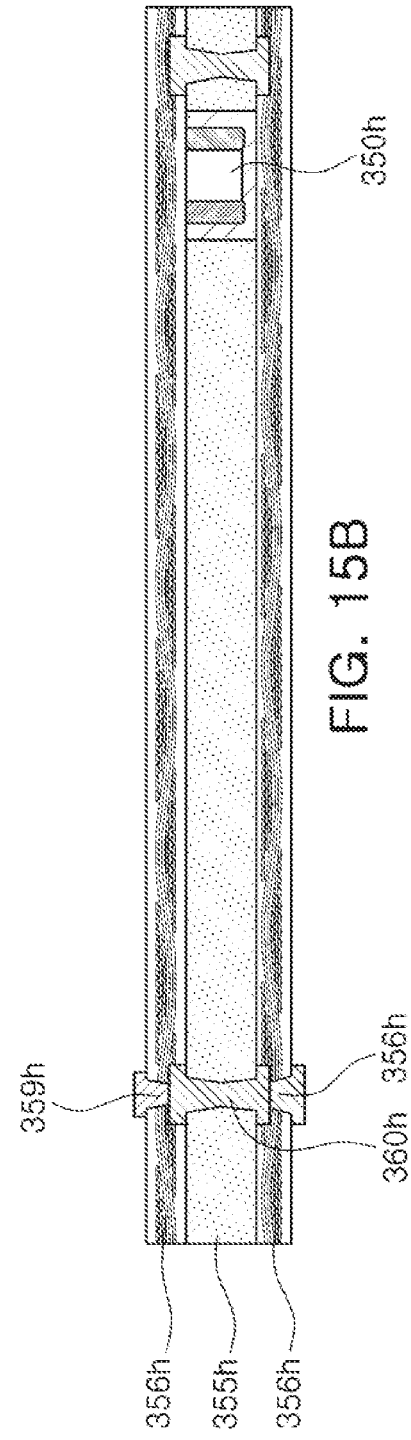

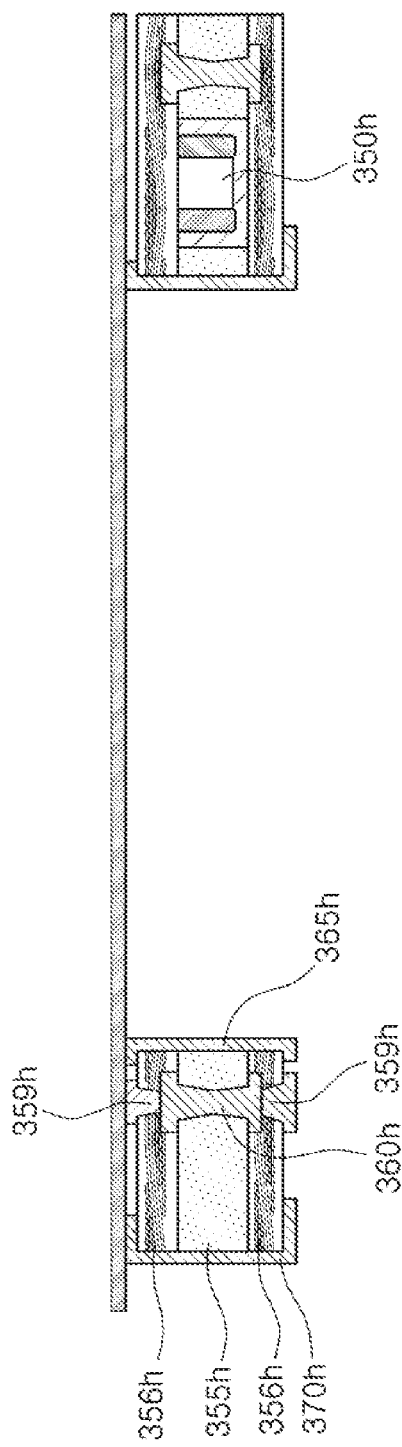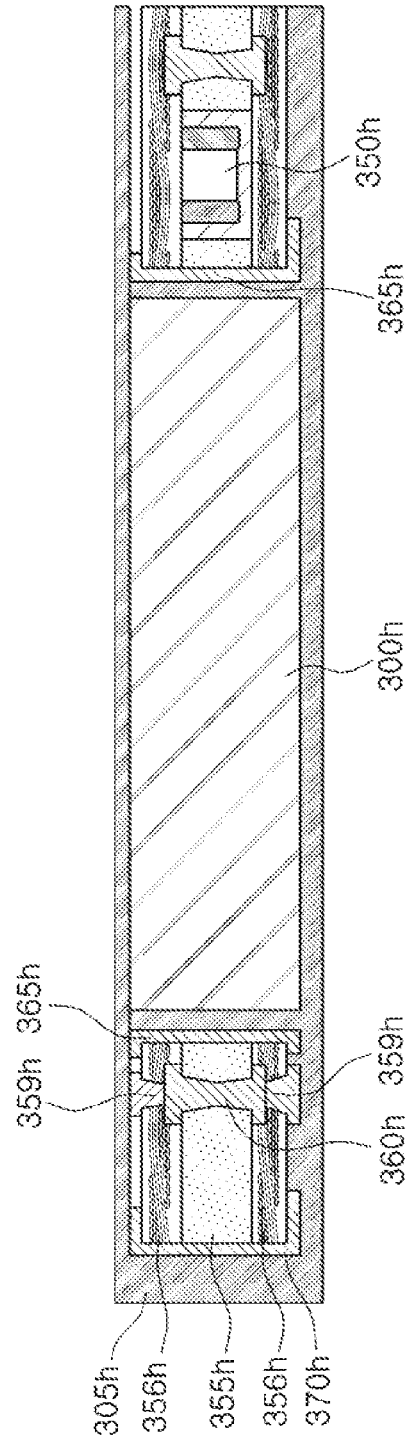

ANTENNA MODULE

CROSS-REFERENCE TO RELATED APPLICATION(S)

This application claims benefit of priority to Korean Patent Application No. 10-2017-0146112 filed on Nov. 3, 2017 in the Korean Intellectual Property Office, the disclosure of which is incorporated herein by reference in its entirety.

TECHNICAL FIELD

The present disclosure relates to an antenna module.

BACKGROUND

Recently, millimeter wave (mmWave) communications including 5th generation (5G) communications have been actively researched, and research into the commercialization of an antenna module able to smoothly implement millimeter wave communications is being actively undertaken.

Conventionally, an antenna module providing a millimeter wave communications environment uses a structure in which an integrated circuit (IC) and an antenna are disposed on a board and are connected to each other by a coaxial cable in order to satisfy a high level of antennal performance (e.g., a transmission and reception rate, a gain, directivity, and the like) according to a high frequency.

However, such a structure may cause a shortage of antenna layout space, a restriction of the degree of freedom of an antenna shape, an increase in interference between the antenna and the IC, and an increase in the size and cost of the antenna module.

SUMMARY

An aspect of the present disclosure may provide an antenna module capable of improving transmission and reception performance of a radio frequency (RF) signal in a first direction, being easily miniaturized, and improving the transmission and reception performance of the RF signal in a second direction by using an antenna package providing an environment capable of easily securing antenna performance.

According to an aspect of the present disclosure, an antenna module may include a fan-out semiconductor package including an integrated circuit (IC), an encapsulant encapsulating at least a portion of the IC, a core member having a first side surface facing the IC or the encapsulant, and a connection member including at least one wiring layer electrically connected to the IC and the core member and at least one insulating layer; and an antenna package including a plurality of first directional antenna members configured to transmit or receive a first radio frequency (RF) signal, a plurality of feed vias each having one end electrically connected to one of the plurality of first directional antenna members and the other end electrically connected to a corresponding wire of the at least one wiring layer, and a dielectric layer having a thickness greater than that of the at least one insulating layer. The fan-out semiconductor package may further include at least one second directional antenna member disposed on a second side surface of the core member opposing the first surface of the core member, stood up to extend in a direction toward the fan-out semiconductor package from a position electrically connected to the at least one wiring layer, and configured to transmit or receive a second RF signal.

According to an aspect of the present disclosure, an antenna module may include an integrated circuit (IC); a wiring package including at least one wiring layer electrically connected to the IC, and at least one insulating layer; and an antenna package including a plurality of first directional antenna members configured to transmit or receive a first radio frequency (RF) signal, a plurality of feed vias each having one end electrically connected to one of the plurality of first directional antenna members and the other end electrically connected to a corresponding wire of the at least one wiring layer, and a dielectric layer having a thickness greater than that of the at least one insulating layer, wherein the antenna package further includes at least one second directional antenna member stood up to extend in a direction toward the antenna package from a corresponding position of the at least one wiring layer and configured to transmit or receive a second RF signal.

BRIEF DESCRIPTION OF DRAWINGS

The above and other aspects, features and other advantages of the present disclosure will be more clearly understood from the following detailed description taken in conjunction with the accompanying drawings, in which:

FIG. 14C is a schematic view illustrating a third operation of an example of a process of manufacturing an antenna package;

FIG. 15A is a schematic view illustrating a first operation of an example of a process of manufacturing a fan-out semiconductor package;

FIG. 15B is a schematic view illustrating a second operation of an example of a process of manufacturing a fan-out semiconductor package;

FIG. 15C is a schematic view illustrating a third operation of an example of a process of manufacturing a fan-out semiconductor package;

FIG. 15D is a schematic view illustrating a fourth operation of an example of a process of manufacturing a fan-out semiconductor package;

DETAILED DESCRIPTION

Hereinafter, exemplary embodiments of the present disclosure will now be described in detail with reference to the accompanying drawings.

Figure 1:
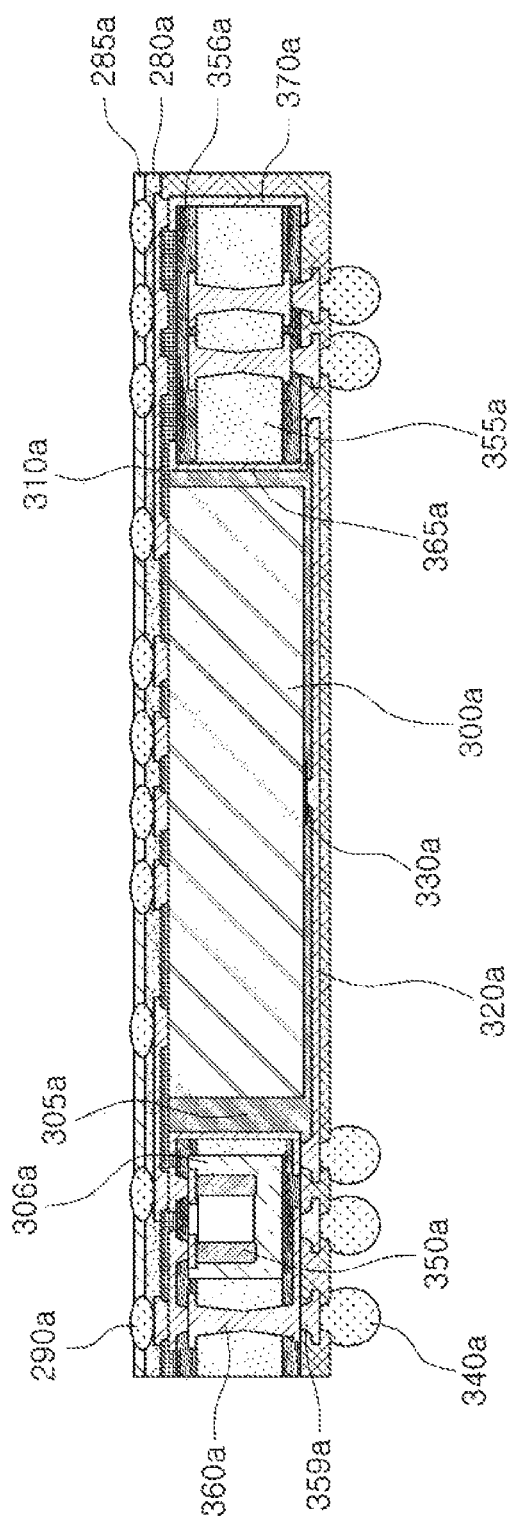
FIG. 1 is a schematic view illustrating an example of a fan-out semiconductor package of an antenna module according to an exemplary embodiment in the present disclosure.

FIG. 1 is a schematic view illustrating an example of a fan-out semiconductor package of an antenna module according to an exemplary embodiment in the present disclosure.

Referring to FIG. 1, a fan-out semiconductor package may include an integrated circuit (IC) 300a, an encapsulant 305a encapsulating at least a portion of the IC 300a, a core member 355a disposed so that a first side surface thereof faces the IC 300a, and a connection member including an insulating layer 280a and at least one wiring layer 310a electrically connected to the IC 300a and the core member 355a.

The fan-out semiconductor package may be coupled to an antenna package to be described below. A first RF signal generated from the IC 300a included in the fan-out semiconductor package may be transmitted to the antenna package through at least one wiring layer 310a and may be transmitted in an upper surface direction of the antenna module, and the first RF signal received by the antenna package may be transmitted to the IC 300a through at least one wiring layer 310a.

In addition, the fan-out semiconductor package may further include at least one second directional antenna member 370a stood up to extend in a direction (e.g., a downward direction) toward the fan-out semiconductor package from a position electrically connected to at least one wiring layer 310a on a second side surface of the core member 355a and configured to transmit or receive a second RF signal. At least one second directional antenna member 370a may receive the second RF signal through at least one wiring layer 310a from the IC 300a, and may transmit the second RF signal to the IC 300a through at least one wiring layer 310a.

That is, the antenna module may transmit and receive the first RF signal to and from the upper surface thereof through the antenna package and transmit and receive the second RF signal to and from the side surface thereof through at least one second directional antenna member 370a. Since at least one second antenna member 370a may transmit and receive the second RF signal in a stood up state, it may improve directivity in a side direction as compared to a second directional antenna member 370a which is folded. Therefore, the antenna module may improve transmission and reception performance of the RF signal in second direction and may omni-directionally expand a transmission and reception direction of the RF signal.

The fan-out semiconductor package may further include a core plating member 365a disposed on a first side surface of the core member 355a. Accordingly, at least one second direction antenna member 370a may secure isolation on the IC 300a and may have boundary conditions (e.g., small manufacturing tolerance, a short electrical length, a smooth surface, a large margin space, an adjustment of a dielectric constant, and the like) advantageous in securing a radiation pattern.

The fan-out semiconductor package may further include connection pads 330a disposed on an upper surface and/or a lower surface of the IC 300a. The connection pad 330a disposed on the upper surface of the IC 300a may be electrically connected to at least one wiring layer 310a, and the connection pad 330a disposed on the lower surface of the IC 300a may be electrically connected to the core member 355a or the core plating member 365a through a lower end wiring layer 320a. Here, the core plating member 365a may provide a ground region to the IC 300a.

The core member 355a may include a core dielectric layer 356a in contact with the connection member, core wiring layers 359a disposed on an upper surface and/or a lower surface of the core dielectric layer 356a, and at least one core via 360a penetrating through the core dielectric layer 356a, electrically connecting the core wiring layers 359a to each other, and electrically connected to the connection pads 330a. At least one core via 360a may be electrically connected to an electrical connection structure 340a such as a solder ball, a pin, and a land.

Accordingly, the core member 355a may receive a base signal or power from a lower surface thereof and may transmit the base signal and/or power to the IC 300a through at least one wiring layer 310a of the connection member.

The IC 300a may generate first and second RF signals of a millimeter wave (mmWave) band using the base signal and/or power. For example, the IC 300a may receive a base signal of a low frequency and may perform a frequency conversion, amplification, a filtering phase control, and a power generation of the base signal, and may be formed of a compound semiconductor (e.g., GaAs) or a silicon semiconductor in consideration of high frequency characteristics. Here, frequencies of the first and second RF signals may be the same as a first frequency (e.g., 28 GHz), and may be different from each other as a first or second frequency (e.g., 28 GHz, 36 GHz) depending on a design.

Meanwhile, the fan-out semiconductor package may further include a passive component 350a electrically connected to a corresponding wire of at least one wiring layer 310a. The passive component 350a may be disposed in an accommodation space 306a provided by the core member 355a and may provide impedance to the IC 300a and/or at least one second directional antennal member 370a. For example, the passive component 350a may include at least a portion of a multilayer ceramic capacitor (MLCC), an inductor, or a chip resistor.

Meanwhile, the fan-out semiconductor package may be coupled to the antenna package through the electrical connection structure 290a and the passivation layer 285a, but the electrical connection structure 290a and the passivation layer 285a may be omitted depending on a design.

Figure 2:
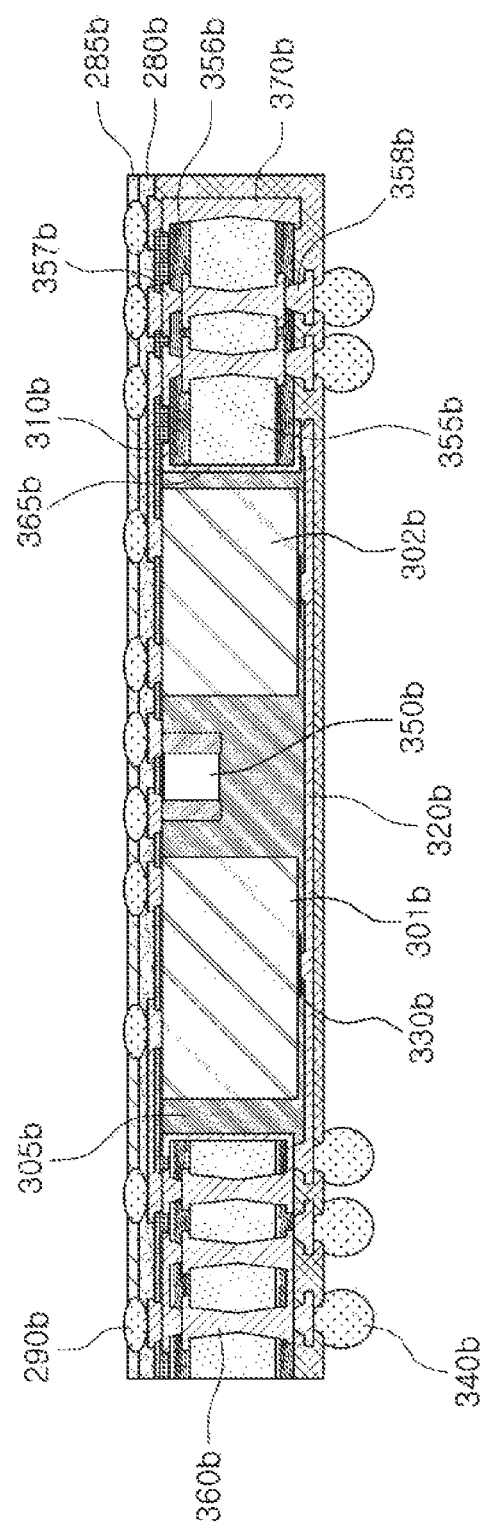
FIG. 2 is a schematic view illustrating another example of a fan-out semiconductor package of an antenna module according to an exemplary embodiment in the present disclosure.

FIG. 2 is a schematic view illustrating another example of a fan-out semiconductor package of an antenna module according to an exemplary embodiment in the present disclosure.

Referring to FIG. 2, the fan-out semiconductor package may include an IC 301b, an encapsulant 305b encapsulating at least a portion of the IC 301b, a core member 355b disposed so that a first side surface thereof faces the IC 301b, at least one wiring layer 310b electrically connected to the IC 301b and the core member 355b, and an connection member including an insulating layer 280b.

The fan-out semiconductor package may further include a PMIC 302b disposed between the core member 355b and the IC 301b and supplying power to the IC 301b through a corresponding wire of at least one wiring layer 310b. The IC 301b may generate first and second RF signals of a millimeter wave (mmWave) band using the power supplied by the PMIC 302b.

The fan-out semiconductor package may further include a passive component 350b that at least a portion thereof is encapsulated by the encapsulant 305b. That is, the IC 301b, the PMIC 302b, and the passive component 350b may be encapsulated together with each other by the encapsulant 305b. The encapsulant 305b may protect the IC 301b, the PMIC 302b, and the passive component 350b from external electrical/physical/chemical impact, and may be formed of a photo imageable encapsulant (PIE), Ajinomoto build-up film (ABF), epoxy molding compound (EMC), or the like, but is not limited thereto.

The core member 355b may include a core dielectric layer 356b in contact with the connection member, a first core wiring layer 357b in contact with the connection member and embedded in the core dielectric layer 356b, a second core wiring layer 358b opposing the first core wiring layer 357b of the core dielectric layer 356b, and at least one core via 360b penetrating through the core dielectric layer 356b, electrically connecting the first and second core wiring layers 357b and 358b to each other, and electrically connected to a connection pad 330b. At least one core via 360b may be electrically connected to an electrical connection structure 340b such as a solder ball.

Here, at least one second directional antenna member 370b disposed on a second side surface of the core member 355b may have a form in which a portion of at least one core via 360b and a portion of the core plating member 365b are bonded to each other. That is, at least one second directional antenna member 370b may be formed in a process of forming at least one core via 360b and/or the core plating member 365b.

Accordingly, if a shape of a left portion in at least one second direction antenna member 370b is the same as that of at least one core via 360b, a left surface of at least one second directional antenna member may be uneven. In addition, if a shape of a right portion in at least one second direction antenna member 370b is the same as that of the core plating member 365b, a right surface of at least one second directional antenna member may be flat.

Meanwhile, the fan-out semiconductor package may be coupled to the antenna package through the electrical connection structure 290b and the passivation layer 285b, but the electrical connection structure 290b and the passivation layer 285b may be omitted depending on a design.

Figure 3:
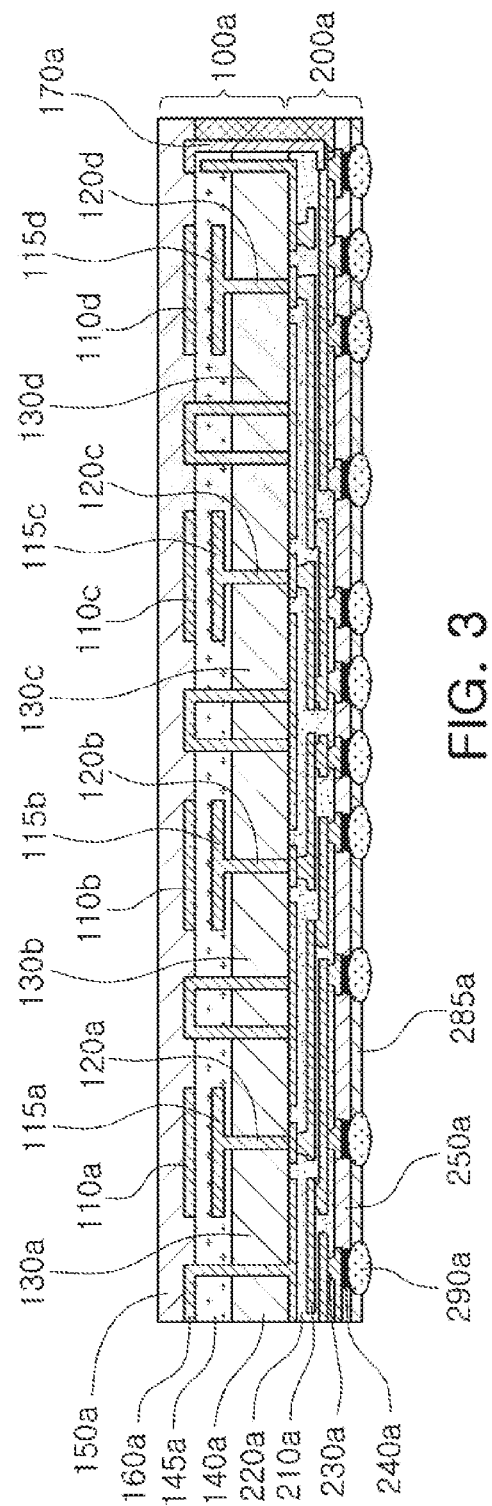
FIG. 3 is a schematic view illustrating an example of an antenna package of an antenna module according to an exemplary embodiment in the present disclosure.

FIG. 3 is a schematic view illustrating an example of an antenna package of an antenna module according to an exemplary embodiment in the present disclosure.

Referring to FIG. 3, an antenna package 100a may include a plurality of first directional antenna members 115a, 115b, 115c, and 115d configured to transmit or receive a first radio frequency (RF) signal, a plurality of feed vias 120a, 120b, 120c, and 120d in which one end of each thereof is electrically connected to each of the plurality of first directional antenna members 115a, 115b, 115c, and 115d and the other end of each thereof is electrically connected to a corresponding wire of at least one wiring layer 210a, and dielectric layers 140a and 145a having thicknesses greater a thickness of at least one insulating layer 220a.

Due to lengths of the feed vias 120a, 120b, 120c, and 120d and thicknesses of the dielectric layers 140a and 145a, a boundary condition for transmission and reception operation of the RF signal of the plurality of first directional antenna members 115a, 115b, 115c, and 115d may be freely designed, and an unnecessary boundary condition (e.g., an interlayer interval, an interlayer implant, or the like) may be removed. Accordingly, since the feed vias 120a, 120b, 120c, and 120d and the dielectric layers 140a and 145a may provide boundary conditions (e.g., small manufacturing tolerance, a short electrical length, a smooth surface, a large margin space, an adjustment of a dielectric constant, and the like) advantageous to the transmission and reception operation of the RF signal of the plurality of first directional antenna members 115a, 115b, 115c, and 115d, antenna performance of the plurality of first directional antenna members 115a, 115b, 115c, and 115d may be improved.

The dielectric layers 140a and 145a may be formed of a thermosetting resin such as an epoxy resin, a thermoplastic resin such as a polyimide resin, a resin in which the thermosetting resin or the thermoplastic resin is impregnated together with an inorganic filler in a core material such as a glass fiber (or a glass cloth or a glass fabric), for example, prepreg, Ajinomoto Build up Film (ABF), FR-4, Bismaleimide Triazine (BT), or the like, and may be formed of a photo imagable dielectric (PID) resin depending on a design. For example, the dielectric layers 140a and 145a may be formed of a generic copper clad laminate (CCL) or a glass or ceramic based insulating material depending on required material characteristics.

The antenna package 100a may be coupled to the fan-out semiconductor package directly or through a wiring package 200a, receive the first and second RF signals from the IC included in the fan-out semiconductor package and transmit the received first and second RF signals to the fan-out semiconductor package.

The antenna package 100a may further include at least one second directional antenna member 170a stood up to extend in a direction toward the antenna package 100a at a corresponding position of at least one wiring layer 210a and configured to transmit or receive the second RF signal.

That is, at least one second directional antenna member included in the antenna module may be included in the fan-out semiconductor package and/or the antenna package 100a, and may transmit and receive the second RF signal to and from side surfaces of the antenna module.

The antenna package 100a may further include a plurality of plating members 160a disposed to surround side surfaces of the plurality of feed vias 120a, 120b, 120c, and 120d and/or a plurality of first directional antenna members 115a, 115b, 115c, and 115d. Accordingly, the plurality of first directional antenna members 115a, 115b, 115c, and 115d may have boundary conditions (e.g., small manufacturing tolerance, a short electrical length, a smooth surface, a large margin space, an adjustment of a dielectric constant, and the like) advantageous in securing a radiation pattern, and may improve isolation therebetween.

The plurality of plating members 160a, which are ground patterns, may be disposed to be in contact with the insulating layer 220a at a lower end of each of the plurality of first directional antenna members 115a, 115b, 115c, and 115d. Accordingly, isolation of the plurality of first directional antenna members 115a, 115b, 115c, and 115d on the IC may be improved.

As the plurality of plating members 160a are formed, the antenna package 100a may have cavities 130a, 130b, 130c, and 130d corresponding to the plurality of first directional antenna members 115a, 115b, 115c, and 115d, respectively. The cavities 130a, 130b, 130c, and 130d may be formed of the same material as the dielectric layers 140a and 145a, but may also be formed of a material having a dielectric constant Dk (e.g., dissipation factor Df) different from that of the dielectric layers 140a and 145a depending on a design.

The antenna package 100a may further include a plurality of first directional director members 110a, 110b, 110c, and 110d disposed on the plurality of first directional antenna members 115a, 115b, 115c, and 115d and configured to transmit or receive the first RF signal together with the plurality of first directional antenna members 115a, 115b, 115c, and 115d. The number of layers in which the plurality of first directional director members 110a, 110b, 110c, and 110d are formed may be determined depending on a design condition of a gain and a height of the antenna module. Therefore, the number of layers is not limited to one.

The antenna package 100a may further include a first encapsulation member 150a disposed on the plurality of first directional antenna members 115a, 115b, 115c, and 115d.

The first encapsulation member 150a may be changed to a solid state from a liquid state in a state in which it partially permeates downwardly in the liquid state. Accordingly, structural stability of the antenna package 100a may be improved. In addition, the first encapsulation member 150a may be formed together with the plurality of first directional director members 110a, 110b, 110c, and 110d in a process of forming the first encapsulation member 150a.

The antenna package 100a may further include a second encapsulation member in contact with a side surface of at least one second directional antenna member 170a. The second encapsulation member may be formed of the same material as that of the first encapsulation member 150a and may be formed together with the first encapsulation member 150a in a process of forming the first encapsulation member 150a.

Meanwhile, the wiring package 200a may include at least one wiring layer 210a, an insulating layer 220a, a via 230a, a connection pad 240a, a passivation layer 250a, and an electrical connection structure 290a, may be implemented as a portion of the fan-out semiconductor package described above, and may have a structure similar to a copper redistribution layer (RDL).

Figure 4:
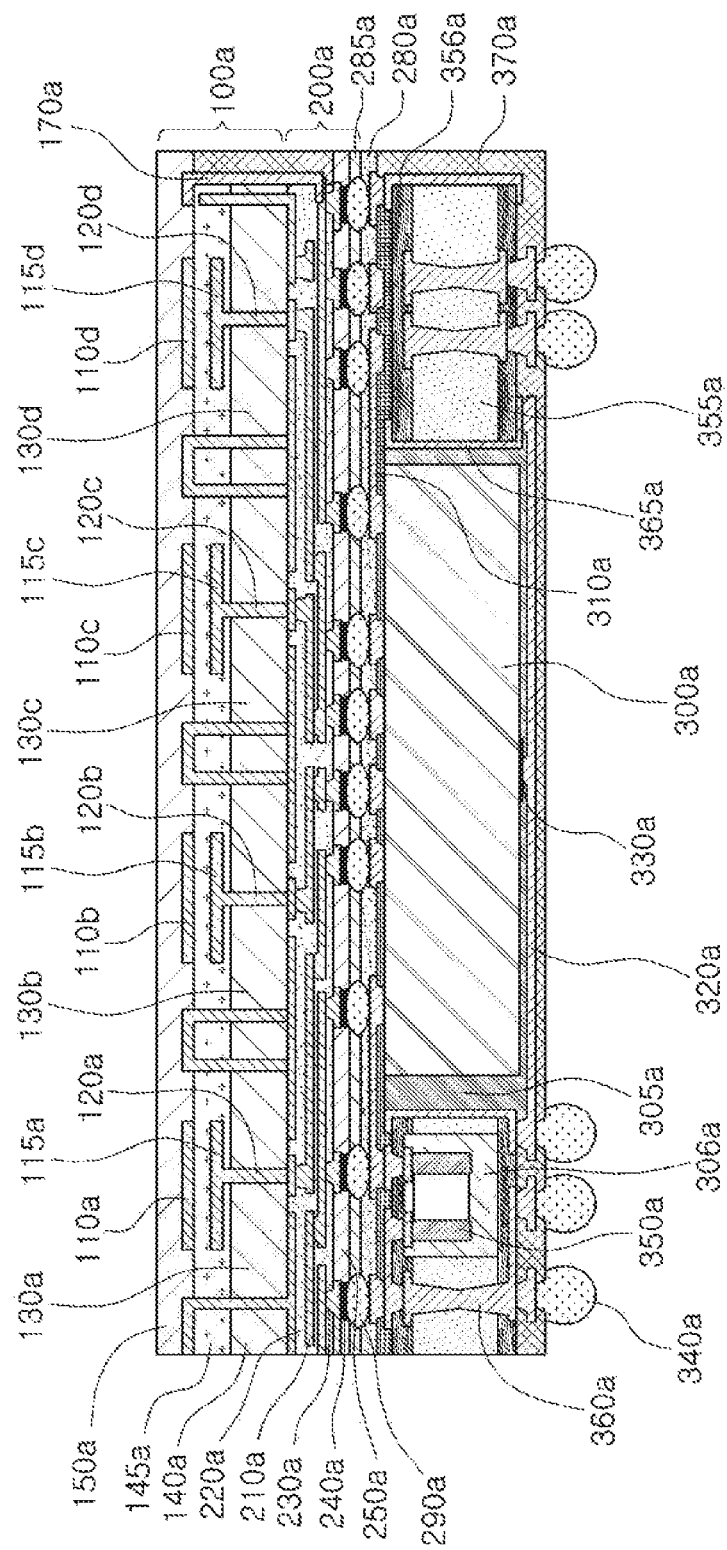
FIG. 4 is a schematic view illustrating an example of an antenna module in which a fan-out semiconductor package and an antenna package are coupled to each other.

FIG. 4 is a schematic view illustrating an example of an antenna module in which a fan-out semiconductor package and an antenna package are coupled to each other.

Referring to FIG. 4, an antenna module a heterogeneous structure in which a fan-out semiconductor package and an antenna package are coupled to each other. That is, the antenna module may be miniaturized while improving antenna performance (e.g., a transmission and reception rate, a gain, directivity, and the like) by utilizing both characteristics that are easy to improve the antenna performance of the antenna package and characteristics that are easy to dispose a circuit pattern or an integrated circuit (IC) of a fan-out semiconductor package.

Referring to FIG. 4, the antenna module may include at least one of the second directional antenna member 370a included in the fan-out semiconductor package and the second directional antenna member 170a included in the antenna package 100a.

Each of the second directional antenna members 170a and 370a may be stood up to extend upwardly or downwardly. The second directional antenna members 170a and 370a which are stood up may improve directivity in a side direction as compared to the second directional antenna members which are folded.

Meanwhile, the fan-out semiconductor package and the antenna package may be manufactured and coupled independently of each other, but may be manufactured together depending on a design. That is, a coupling process between a plurality of packages may be omitted.

Figure 5:
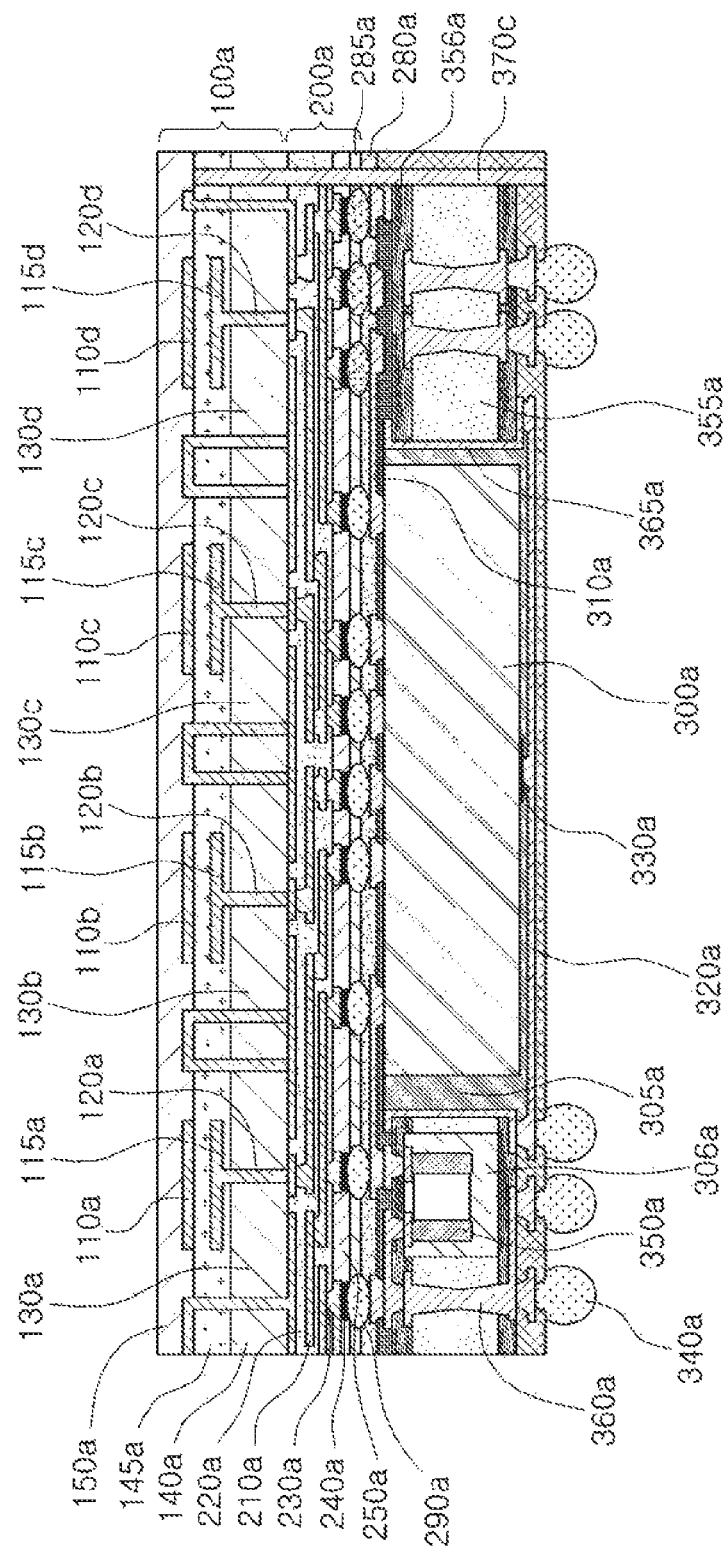
FIG. 5 is a schematic view illustrating another example of an antenna module in which a fan-out semiconductor package and an antenna package are coupled to each other.

FIG. 5 is a schematic view illustrating another example of an antenna module in which a fan-out semiconductor package and an antenna package are coupled to each other.

Referring to FIG. 5, the antenna module may include a second directional antenna member 370c extending from a position electrically connected to at least one wiring layer 210a to both directions.

In a case in which each of the second directional antenna members 170a and 370a illustrated in FIG. 4 has a monopole form, the second directional antenna member 370c illustrated in FIG. 5 may have the dipole form.

Meanwhile, the second directional antenna member 370c may be formed by filling a metal material (e.g., a conductive material such as copper (Cu), aluminum (Al), silver (Ag), tin (Sn), gold (Au), nickel (Ni), lead (Pb), titanium (Ti), or alloys thereof) through a lower end of the fan-out semiconductor package.

Figure 6:
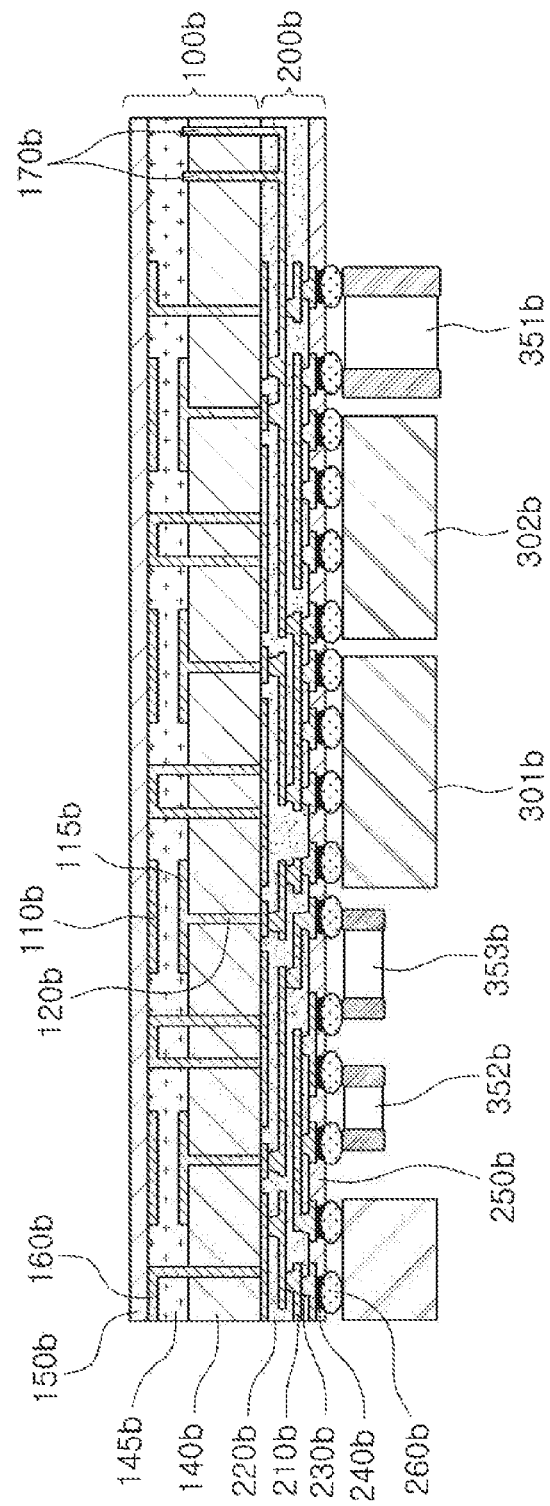
FIG. 6 is a schematic view illustrating an example of an antenna module in which an antenna package and a wiring package coupled to each other.

FIG. 6 is a schematic view illustrating an example of an antenna module in which an antenna package and a wiring package coupled to each other.

Referring to FIG. 6, the antenna module may include an IC 301b, a wiring package 200b, and an antenna package 100b. The wiring package 200b may include at least one wiring layer 210b electrically connected to the IC 301b, at least one insulating layer 220b, a via 230b, a connection pad 240b, a passivation layer 250b, and an electrical connection structure 260b. The antenna package 100b may include a plurality of first directional antenna members 115b configured to transmit or receive a first RF signal, a plurality of feed vias 120b in which one end of each thereof is electrically connected to each of the plurality of first directional antenna members 115b and the other end of each thereof is electrically connected to a corresponding wire of at least one wiring layer 210b, and dielectric layers 140b and 145b having thicknesses greater than that of at least one insulating layer 220b.

The antenna package 100b may further include at least one second directional antenna member 170b stood up to extend in a direction toward the antenna package 100b at a corresponding position of at least one wiring layer 210b and configured to transmit or receive the second RF signal.

That is, the antenna module may transmit and receive the first RF signal to and from the upper surface thereof through the antenna package and transmit and receive the second RF signal to and from the side surface thereof through at least one second directional antenna member 170b. Since at least one second antenna member 170b may transmit and receive the second RF signal in a stood up state, it may improve directivity in a side direction as compared to the second directional antenna member 170b which is folded. Therefore, the antenna module may improve transmission and reception performance of the RF signal in second direction and may omni-directionally expand a transmission and reception direction of the RF signal.

Therefore, at least one second directional member 170b may have a structure in which at least one second directional director member is additionally disposed. That is, in a case in which at least one second directional antenna member 170b is stood up, since a layout space of at least one second directional director member may be further secured, antenna performance (e.g.; a transmission and reception rate, a gain, directivity, and the like) in a side direction of the antenna module may be further improved.

The antenna package 100b may further include a plurality of first directional director members 110b disposed on the plurality of first directional antenna members 115b, a first encapsulation member 150b, and a plurality of plating members 160b surrounding each of side surfaces of the plurality of first directional antenna members 115b.

In addition, the plurality of plating members 160b may block between at least one second directional antenna member 170b and the plurality of first directional antenna members 115b, and may be disposed to extend up to a lower end of each of the plurality of first directional antenna members 115b as ground patterns. Accordingly, antenna performance (e.g., a transmission and reception rate, a gain, directivity, and the like) in an upper surface direction of the antenna module may be improved.

Meanwhile, an IC 301b, a PMIC 302b, a plurality of passive components 351b, 352b, and 353b, and a core member may be disposed below the wiring package 200b.

Figure 7:
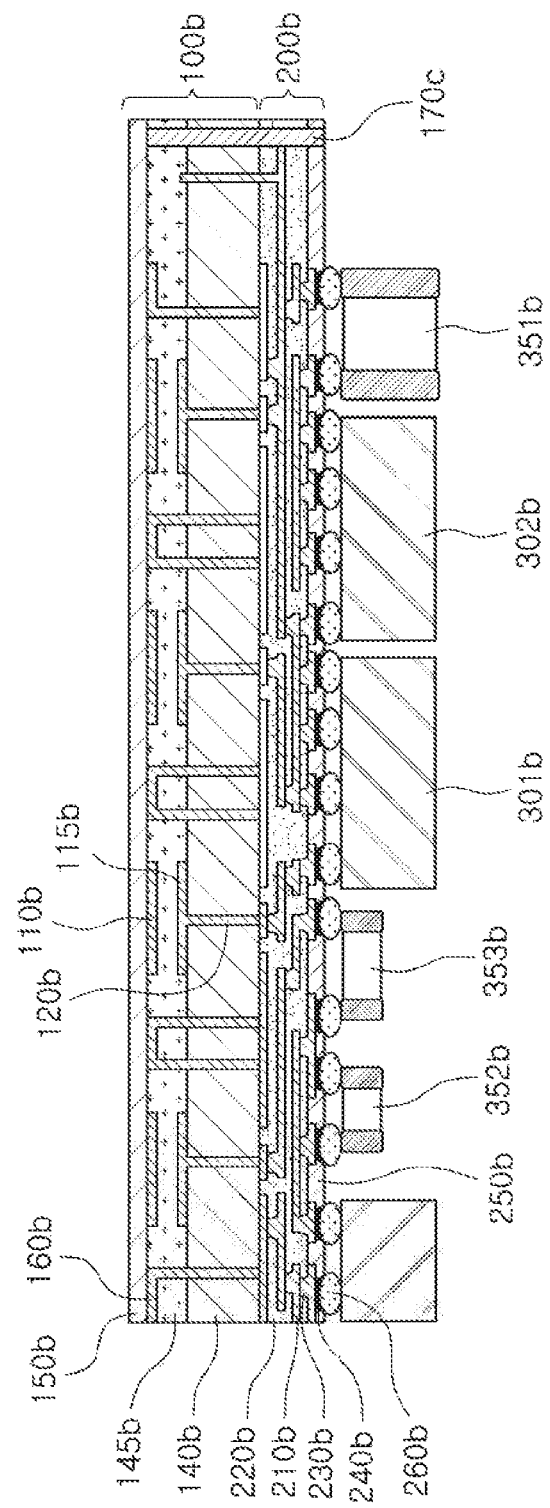
FIG. 7 is a schematic view illustrating another example of an antenna module in which an antenna package and a wiring package coupled to each other.

FIG. 7 is a schematic view illustrating another example of an antenna module in which an antenna package and a wiring package coupled to each other.

Referring to FIG. 7, at least one second directional antenna member 170c may extend to both directions from a position electrically connected to at least one wiring layer 210a.

For example, at least one second directional antenna member 170c may be formed by filling a metal material (e.g., a conductive material such as copper (Cu), aluminum (Al), silver (Ag), tin (Sn), gold (Au), nickel (Ni), lead (Pb), titanium (Ti), or alloys thereof) through a lower end of the wiring package 200b.

Figure 8:
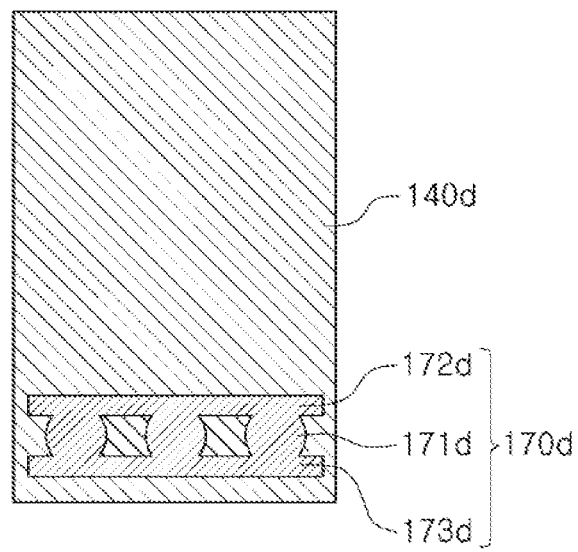
FIG. 8 is a schematic view illustrating a first operation of an example of a process of manufacturing a second directional antenna member of an antenna module.

FIG. 8 is a schematic view illustrating a first operation of an example of a process of manufacturing a second directional antenna member of an antenna module.

Referring to FIG. 8, a second directional antenna member 170d in the first operation may have a form in which a plurality of feed vias 171d and via plated body 172d and 173d are bonded to each other in a dielectric layer 140d.

Figure 9A:
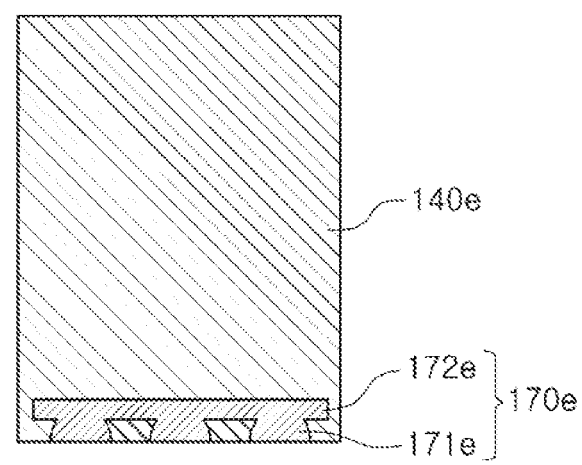
FIGS. 9A and 9B are schematic views illustrating a second operation of an example of a process of manufacturing a second directional antenna member.
Figure 9B:
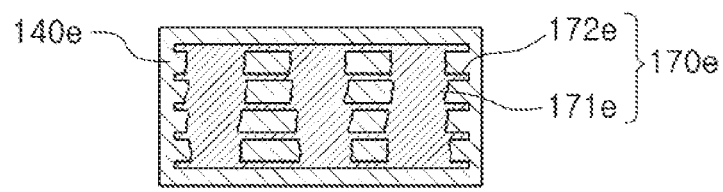

FIG. 9A is a schematic plan view illustrating a second operation of an example of a process of manufacturing a second directional antenna member and FIG. 9B is a schematic cross-sectional view illustrating a second operation of an example of a process of manufacturing a second directional antenna member.

Referring to FIGS. 9A and 9B, a second directional antenna member 170e in the second operation may have a form in which cut bodies 171e of a plurality of feed vias and a single via plated body 172e are boned to each other in a dielectric layer 140e.

Figure 10A:
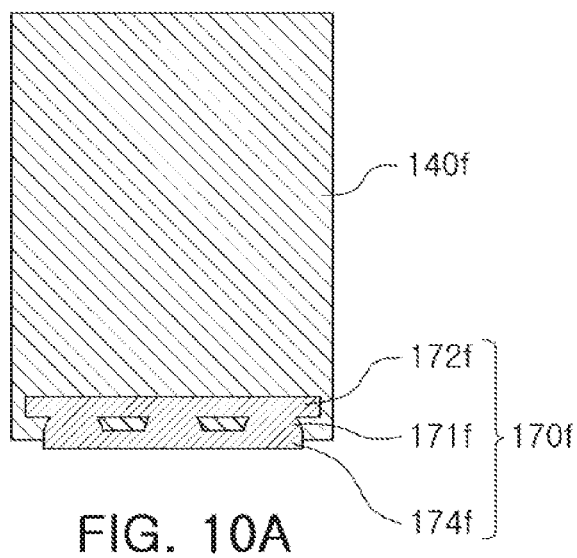
FIGS. 10A and 10B are schematic views illustrating a third operation of an example of a process of manufacturing a second directional antenna member.
Figure 10B:
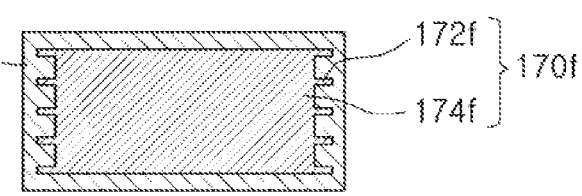

FIG. 10A is a schematic plan view illustrating a third operation of an example of a process of manufacturing a second directional antenna member and FIG. 10B is a schematic cross-sectional view illustrating a third operation of an example of a process of manufacturing a second directional antenna member.

Referring to FIGS. 10A and 10B, a second directional antenna member 170f in the third operation may have a form in which cut bodies 171f of a plurality of feed vias and a plurality of via plated bodies 172f and 174f are boned to each other in a dielectric layer 140f.

Figure 11:
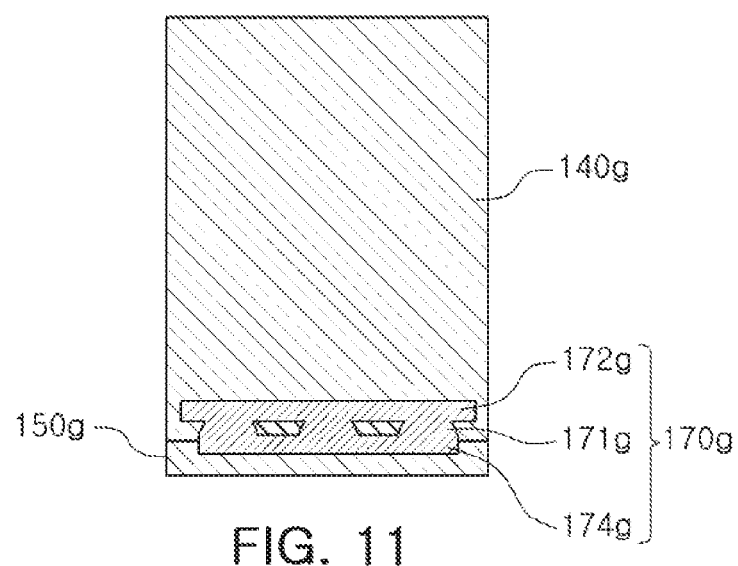
FIG. 11 is a schematic view illustrating a fourth operation of an example of a process of manufacturing a second directional antenna member.

FIG. 11 is a schematic view illustrating a fourth operation of an example of a process of manufacturing a second directional antenna member.

Referring to FIG. 11, a second directional antenna member 170g in the fourth operation may have a form in which cut bodies 171g of a plurality of feed vias and a plurality of via plated bodies 172g and 174g are boned to each other in a dielectric layer 140g, and may be in contact with a second encapsulation member 150g.

Figure 12:
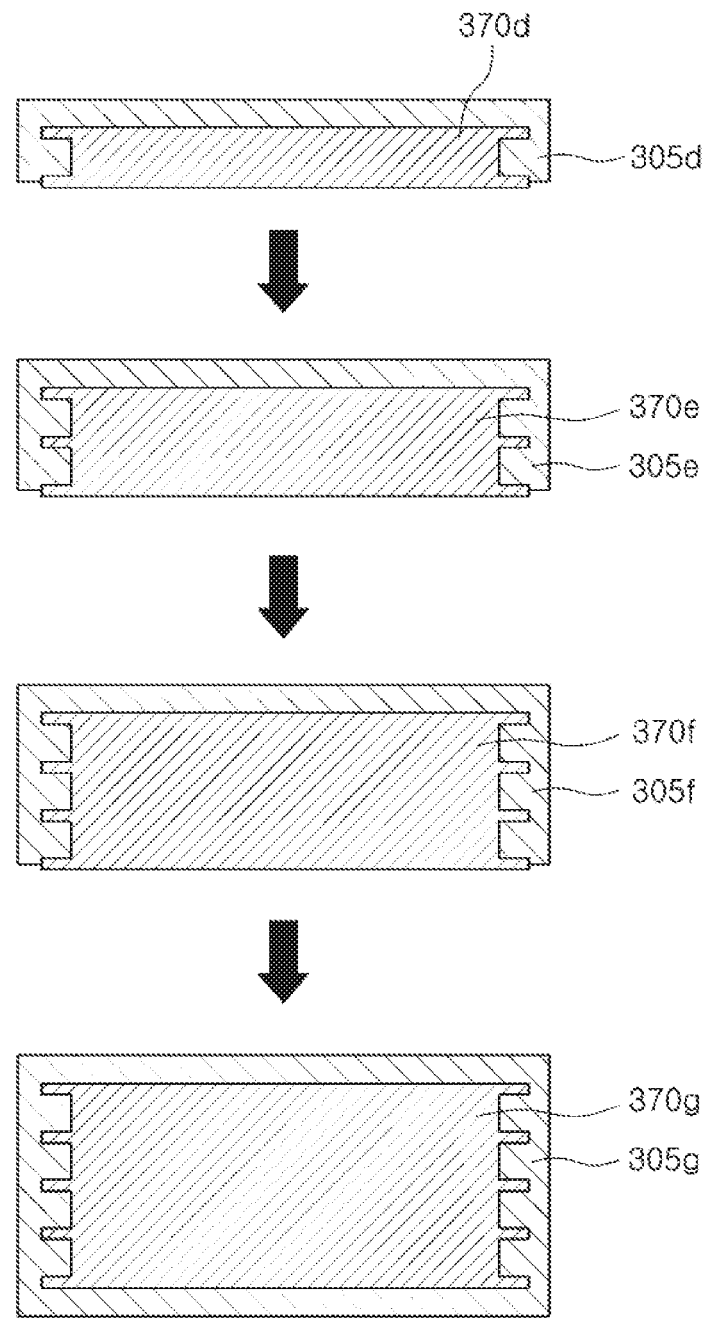
FIG. 12 is a schematic view illustrating another example of a process of manufacturing a second directional antenna member.

FIG. 12 is a schematic view illustrating another example of a process of manufacturing a second directional antenna member.

Referring to FIG. 12, the second directional antenna members 170d, 170e, 170f, and 170g may be formed together with the encapsulation members 305d, 305e, 305f, and 305g in a way in which the plurality of vias and the plurality of layers are alternately stacked.

Figure 13:
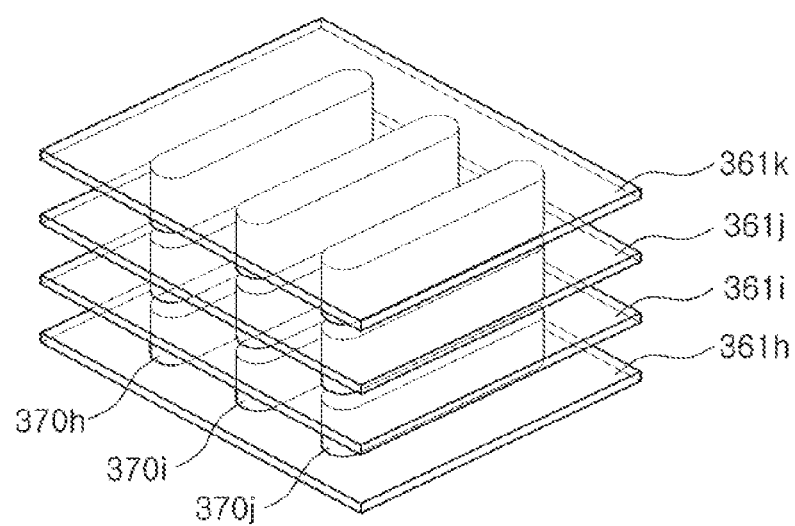
FIG. 13 is a schematic perspective view illustrating an example of a second directional antenna member.

FIG. 13 is a schematic perspective view illustrating an example of a second directional antenna member.

Referring to FIG. 13, the second directional antenna member may include a plurality of layers 361h, 361i, 361j, and 361k and a plurality of vias 370h, 370i, and 370j.

FIGS. 14A through 14E is schematic views illustrating first to fifth operations of an example of a process of manufacturing an antenna package.

Figure 14A:
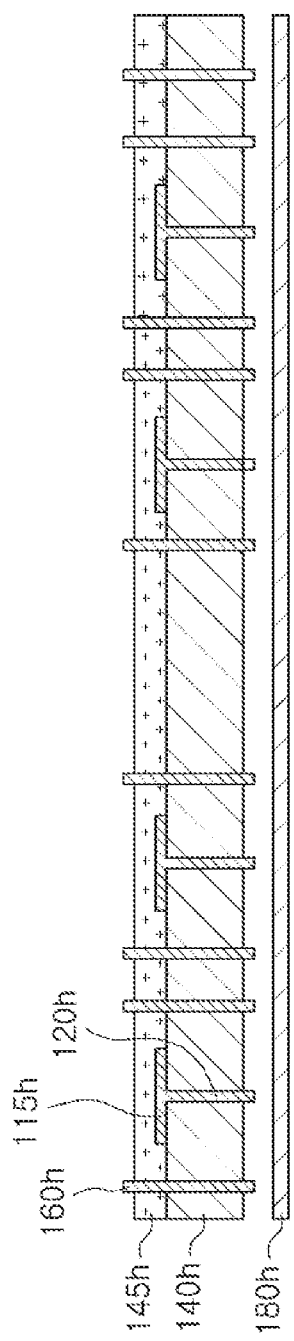
FIG. 14A is a schematic view illustrating a first operation of an example of a process of manufacturing an antenna package.

Referring to FIG. 14A, a first dielectric layer 140h in which a feed via 120h and a first plating member 160h are disposed, and a second dielectric layer 145h in which a first directional antenna member 115h is disposed may be compressed to a film 180h. The feed via 120h may be formed of a conductive material such as copper (Cu), aluminum (Al), silver (Ag), tin (Sn), gold (Au), nickel (Ni), lead (Pb), titanium (Ti), or an alloy thereof.

Figure 14B:
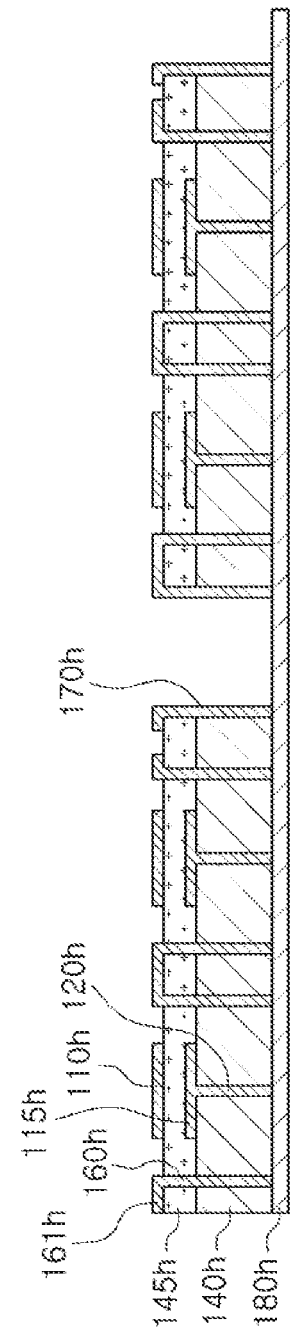
FIG. 14B is a schematic view illustrating a second operation of an example of a process of manufacturing an antenna package.

Referring to FIG. 14B, portions of the first and second dielectric layers 140h and 145h may be etched, a second plating member 161h may be disposed on the second dielectric layer 145h, and the second directional antenna member 170h may be formed on the etched surfaces of the first and second dielectric layers 140h and 145h by a plating method.

Referring to FIG. 14C, an encapsulation member 150h may be formed on an upper end of the second dielectric layer 145h and a side surface of the second directional antenna member 170h. A film 180h may be then removed.

Figure 14D:
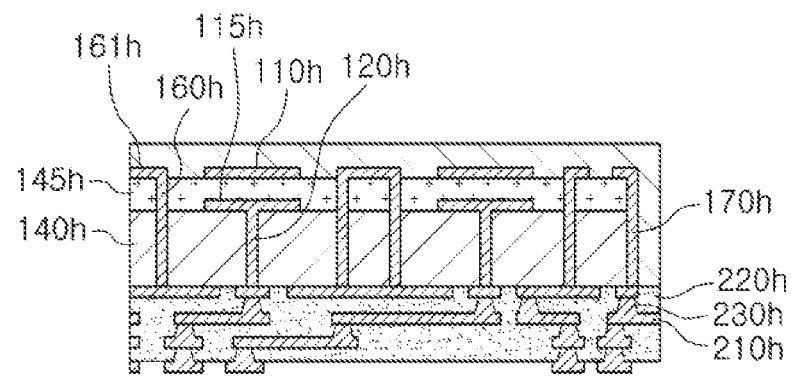
FIG. 14D is a schematic view illustrating a fourth operation of an example of a process of manufacturing an antenna package.

Referring to FIG. 14D, a via 230h may be connected to a lower end of the feed via 120h and a lower end of the second directional antenna member 170h, at least one wiring layer 210h may be connected to the via 230h, and an insulating layer 220h may cover the via 230h and at least one wiring layer 210h.

Figure 14E:
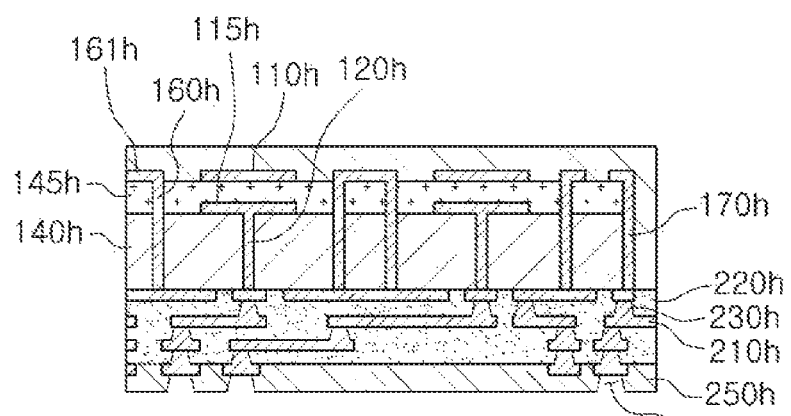
FIG. 14E is a schematic view illustrating a fifth operation of an example of a process of manufacturing an antenna package.

Referring to FIG. 14E, a passivation layer 250h may have a layout space 240h of the connection pad and may be disposed at the lower end of at least one wiring layer 210h.

FIGS. 15A through 15G is schematic views illustrating first to seventh operations of an example of a process of manufacturing a fan-out semiconductor package.

Referring to FIG. 15A, a core member 355h having a core via 360h inserted thereinto and an accommodation space of a passive component 350h may be compressed to a film 380h. The core via 360h may be formed of a conductive material such as copper (Cu), aluminum (Al), silver (Ag), tin (Sn), gold (Au), nickel (Ni), lead (Pb), titanium (Ti), or an alloy thereof.

Referring to FIG. 15B, a core dielectric layer 356h may be disposed on each of the opposite surfaces of the core member 355h, and a core wiring layer 359h may be connected to each of the opposite ends of the core via 360h.

Referring to FIG. 15C, portions of the core member 355h and the core dielectric layer 356h may be etched, and a core plating member 365h and a second directional antenna member 370h may be formed on the etched surfaces of the core member 355h and the core dielectric layer 356h by a plating method. The film 380h may be then removed.

Referring to FIG. 15D, an IC 300h may be disposed on the etched portions of the core member 355h and the core dielectric layer 356h, and an encapsulant 305h may encapsulate at least a portion of the IC 300h. The fan-out semiconductor package in the fourth operation may be rotated in a process of performing the fifth operation.

Figure 15E:
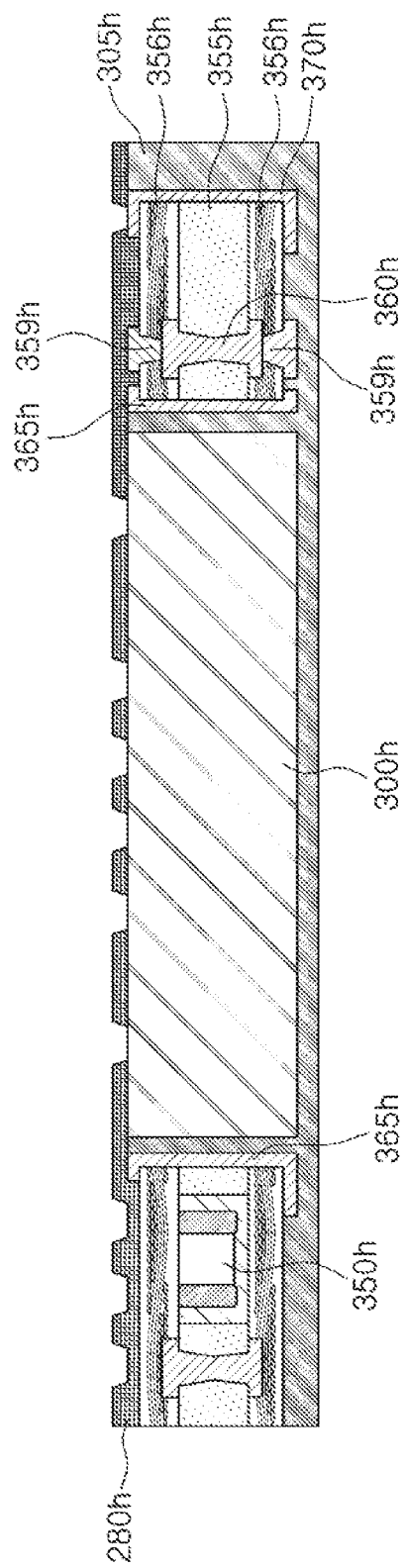
FIG. 15E is a schematic view illustrating a fifth operation of an example of a process of manufacturing a fan-out semiconductor package.

Referring to FIG. 15E, an insulating layer 280h may be disposed on the IC 300h and the core member 355h.

Figure 15F:
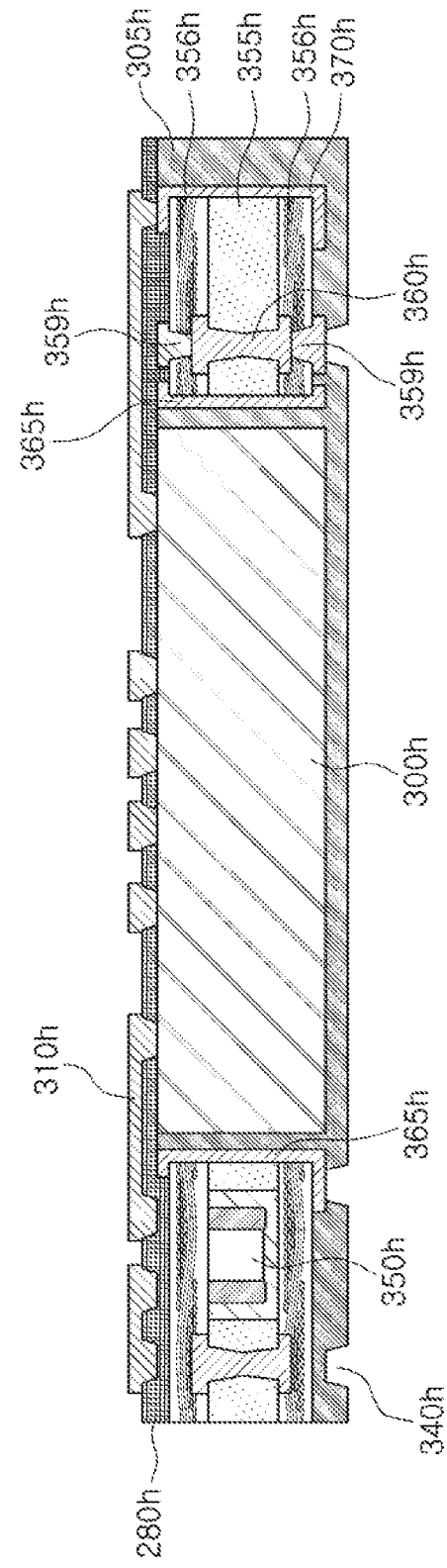
FIG. 15F is a schematic view illustrating a sixth operation of an example of a process of manufacturing a fan-out semiconductor package.

Referring to FIG. 15F, at least one wiring layer 310h may be disposed on the core member 355h to electrically connect the second directional antenna member 370h and/or the core via 360h to the IC 300h, and may be formed of a conductive material such as copper (Cu), aluminum (Al), silver (Ag), tin (Sn), gold (Au), nickel (Ni), lead (Pb), titanium (Ti), or an alloy thereof.

Figure 15G:
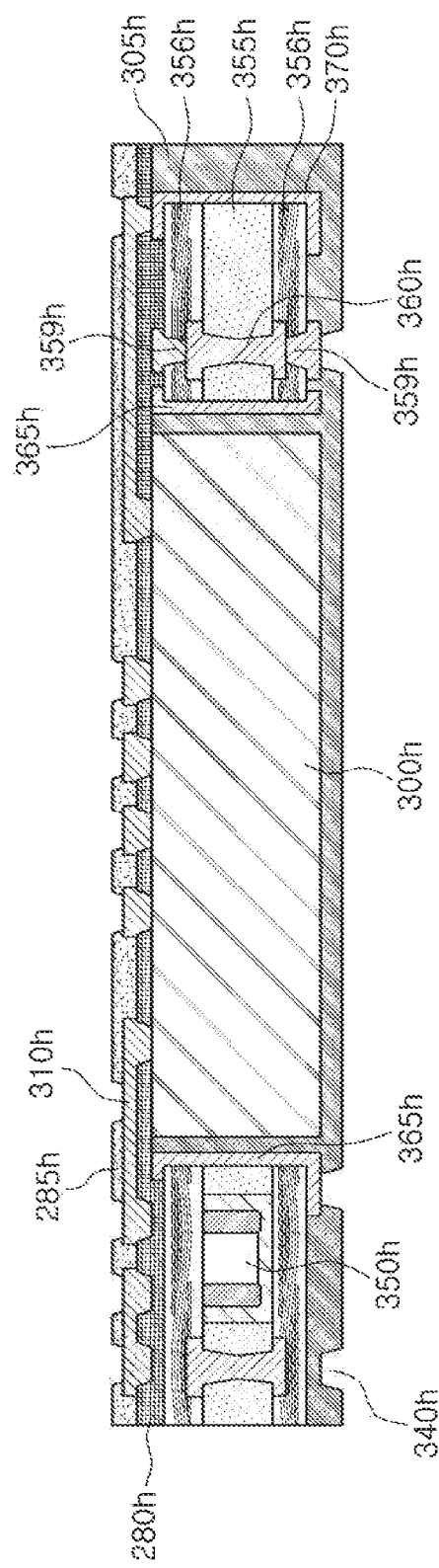
FIG. 15G is a schematic view illustrating a seventh operation of an example of a process of manufacturing a fan-out semiconductor package.

Referring to FIG. 15G, a passivation layer 285h may have a layout space of the connection pad or the electrical connection structure and may be disposed on at least one wiring layer 310h.

Figure 16:
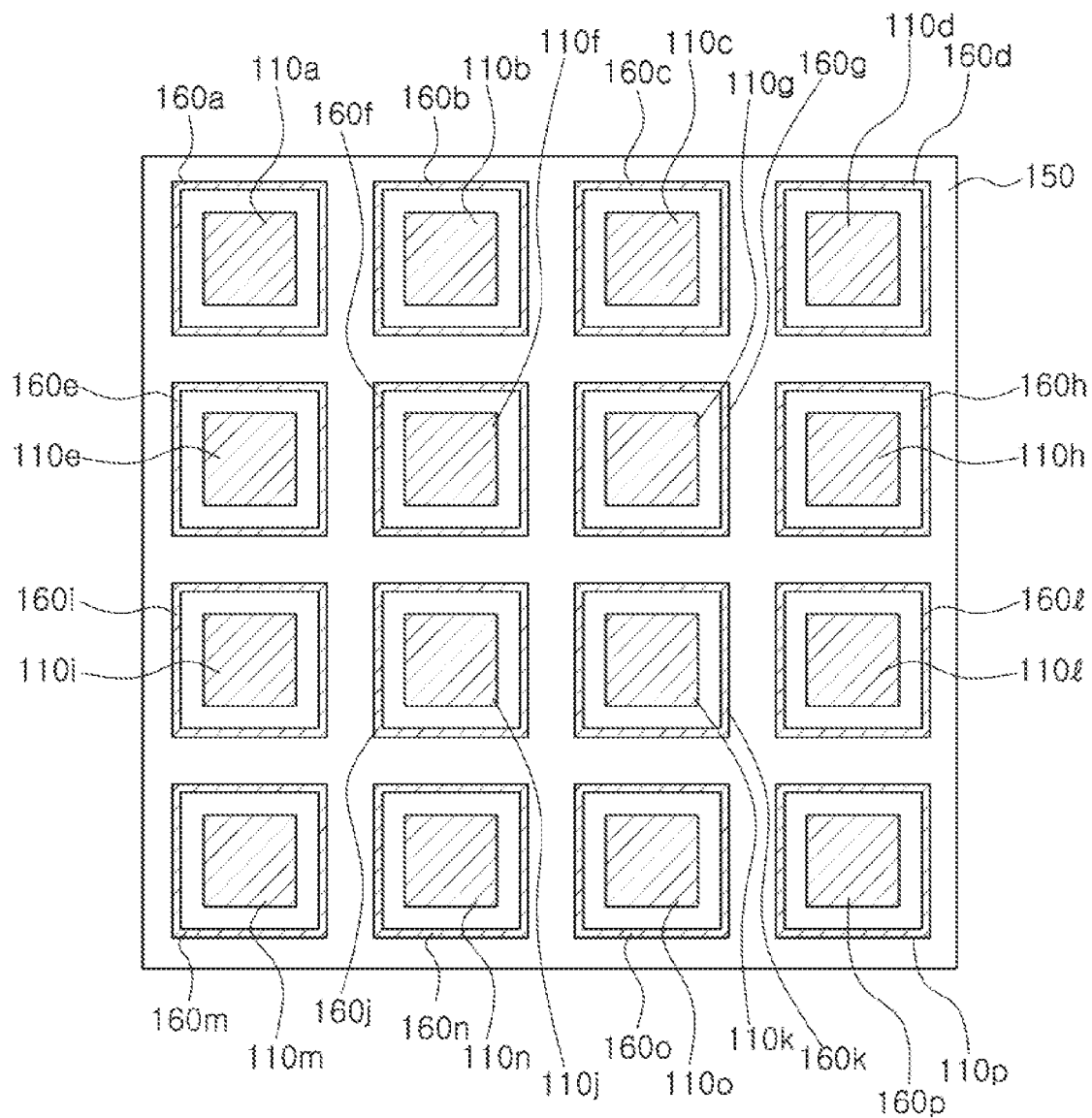
FIG. 16 is a schematic view illustrating an upper surface of an example of an antenna module according to an exemplary embodiment in the present disclosure.

FIG. 16 is a schematic view illustrating an upper surface of an example of an antenna module according to an exemplary embodiment in the present disclosure.

Referring to FIG. 16, each of a plurality of first directional director members 110a, 110b, 110c, 110d, 110e, 110f, 110g, 110h, 110i, 110j, 110k, 110l, 110m, 110n, 110o, and 110p may have a form of a patch antenna and may be surrounded by a corresponding plating member of a plurality of plating members 160a, 160b, 160c, 160d, 160e, 160f, 160g, 160h, 160i, 160j, 160k, 160l, 160m, 160n, 160o, and 160p. If the antenna module does not include the plurality of first directional director members, the plurality of first directional director members 110a, 110b, 110c, 110d, 110e, 110f, 110g, 110h, 110i, 110j, 110k, 110l, 110m, 110n, 110o, and 110p may be replaced with a plurality of first directional antenna members.

Figure 17:
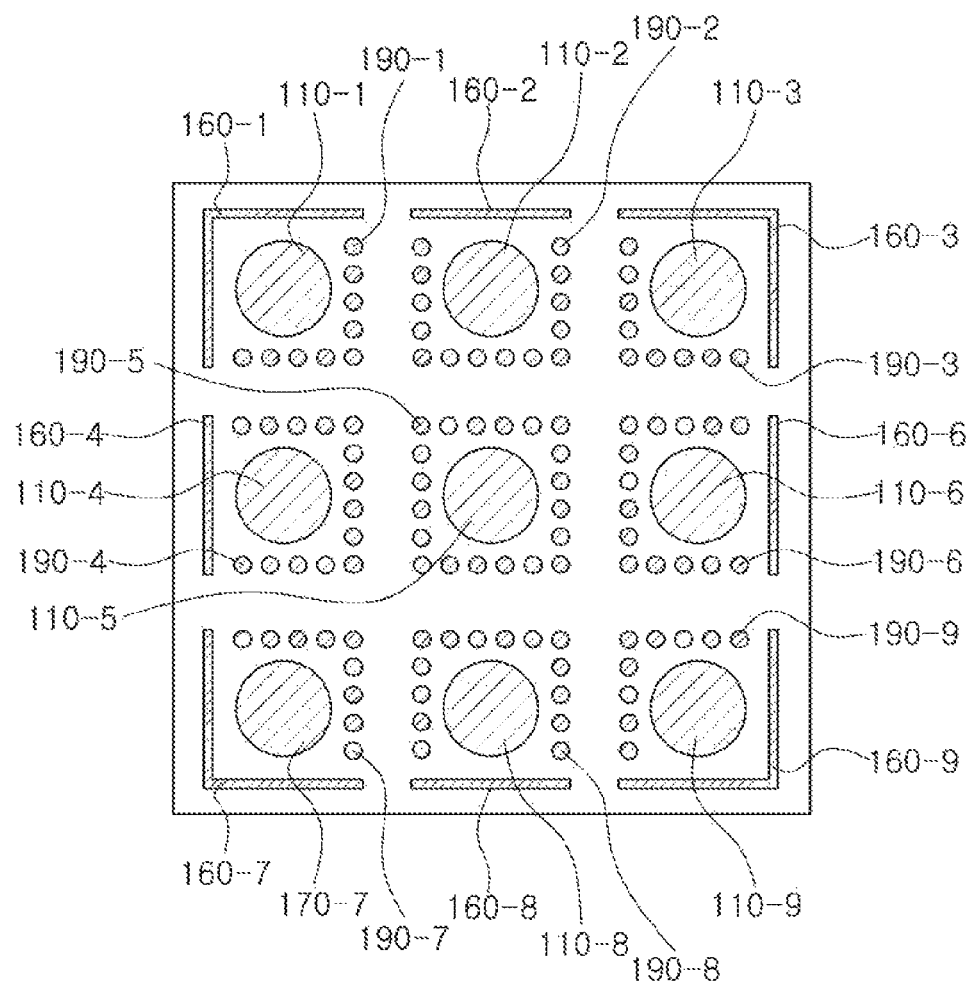
FIG. 17 is a schematic view illustrating an upper surface of another example of an antenna module according to an exemplary embodiment in the present disclosure.

FIG. 17 is a schematic view illustrating an upper surface of another example of an antenna module according to an exemplary embodiment in the present disclosure.

Referring to FIG. 17, each of a plurality of first directional director members 110-1, 110-2, 110-3, 110-4, 110-5, 110-6, 110-7, 110-8, and 110-9 may be surrounded by at least one of corresponding plating members 160-1, 160-2, 160-3, 160-4, 160-5, 160-6, 160-7, 160-8, and 160-9, and a plurality of shielding vias 190-1, 190-2, 190-3, 190-4, 190-5, 190-6, 190-7, 190-8, and 190-9. If the antenna module does not include the plurality of first directional director members, the plurality of director members 110-1, 110-2, 110-3, 110-4, 110-5, 110-6, 110-7, 110-8, and 110-9 may be replaced with a plurality of first directional antenna members.

Meanwhile, the number, layout, and shape of the plurality of first directional antenna members illustrated in FIGS. 16 and 17 are not particularly limited. For example, the shape of the plurality of first directional director members illustrated in FIG. 16 may be circular shape, and the number of the plurality of first directional antenna members illustrated in FIG. 17 may be four.

Hereinafter, to facilitate understanding of the fan-out semiconductor package disclosed herein, a detail description thereof will be made with reference to FIGS. 18 through 25.

Figure 18:
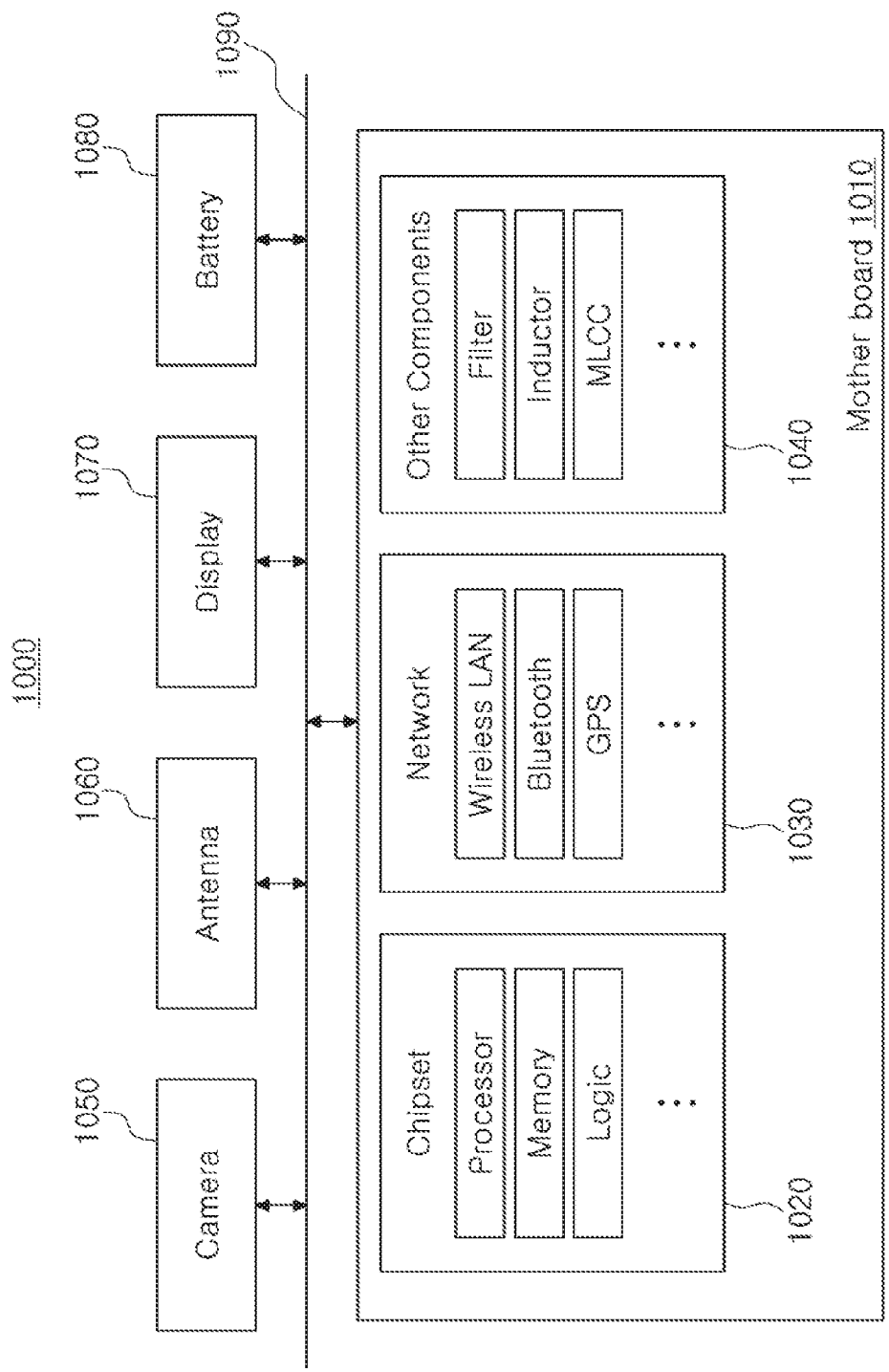
FIG. 18 is a schematic block diagram illustrating an example of an electronic device system.

FIG. 18 is a schematic block diagram illustrating an example of an electronic device system.

Referring to FIG. 18, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), highspeed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 19:
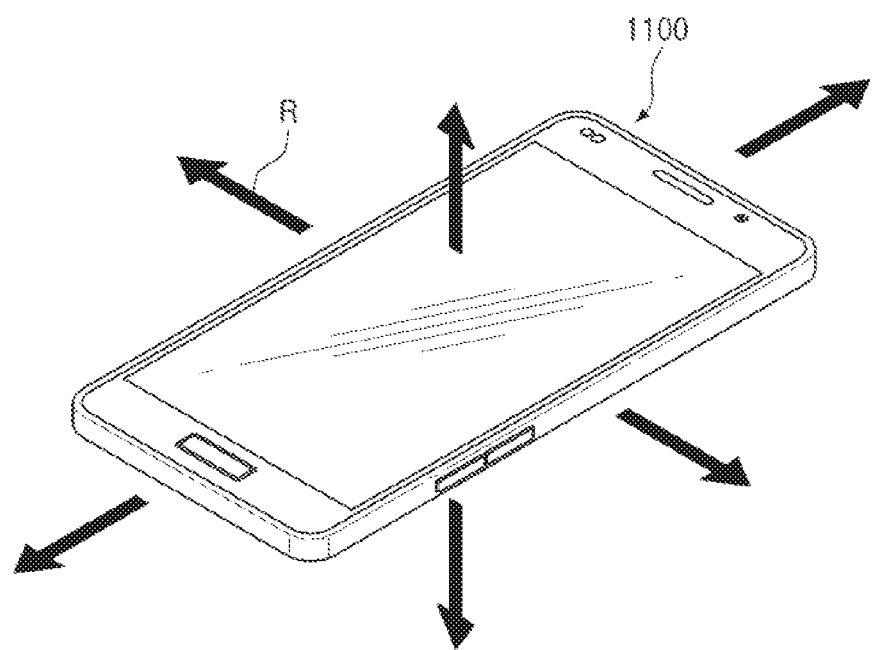
FIG. 19 is a schematic perspective view illustrating an example of an electronic device.

FIG. 19 is a schematic perspective view illustrating an example of an electronic device.

Referring to FIG. 19, an electronic device may be, for example, a smartphone 1100. In the smartphone 1100, a radio frequency integrated circuit (RFIC) may be used in a semiconductor package form, and an antenna may be used in a substrate or module form. The RFIC and the antenna may be electrically connected to each other in the smartphone 1100, and radiation R of antenna signals in various directions may be thus possible. A semiconductor package including the RFIC and a substrate or a module including the antenna may be used in various forms in an electronic device such as the smartphone, or the like.

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Figure 20B:
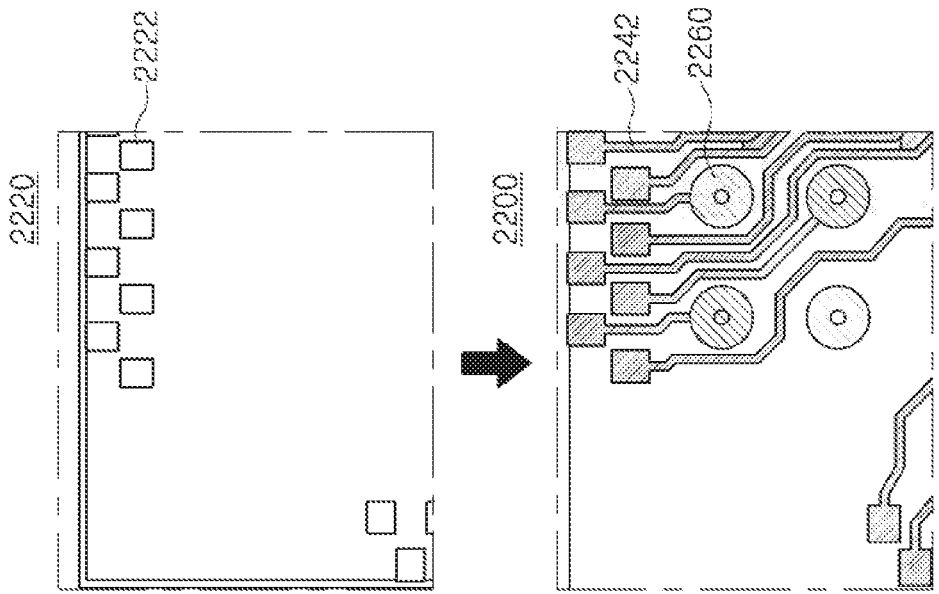
FIGS. 20A and 20B are a schematic cross-sectional view illustrating states of a fan-in semiconductor package before and after being packaged.
Figure 20A:
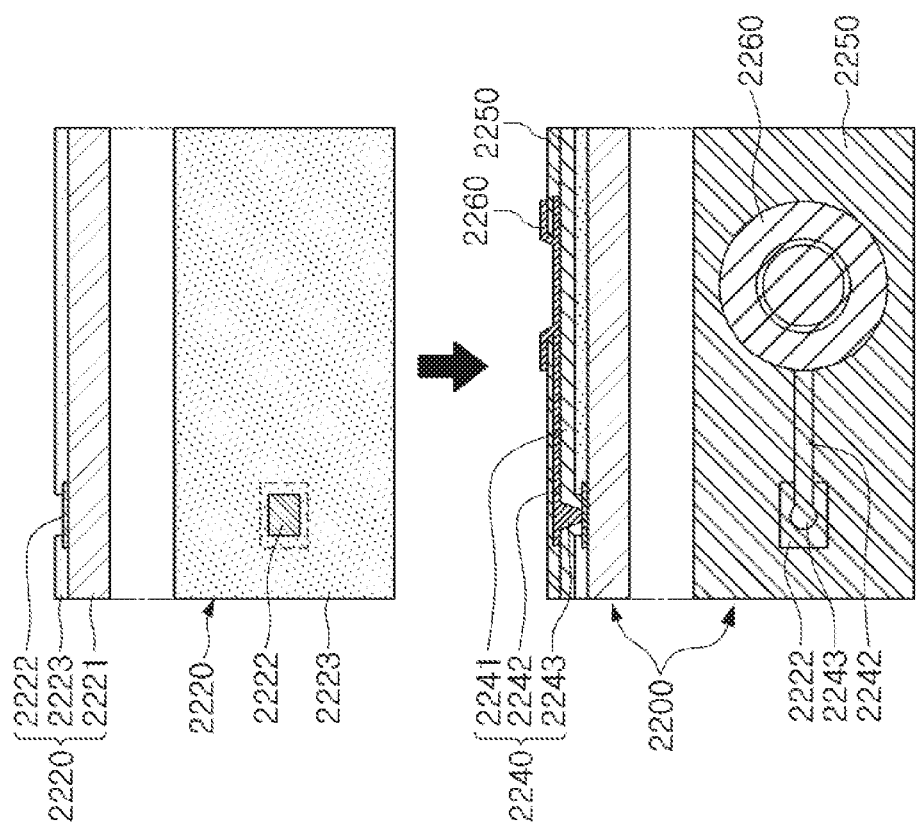

FIGS. 20A and 20B are schematic cross-sectional views illustrating states of a fan-in semiconductor package before and after being packaged.

Figure 21:
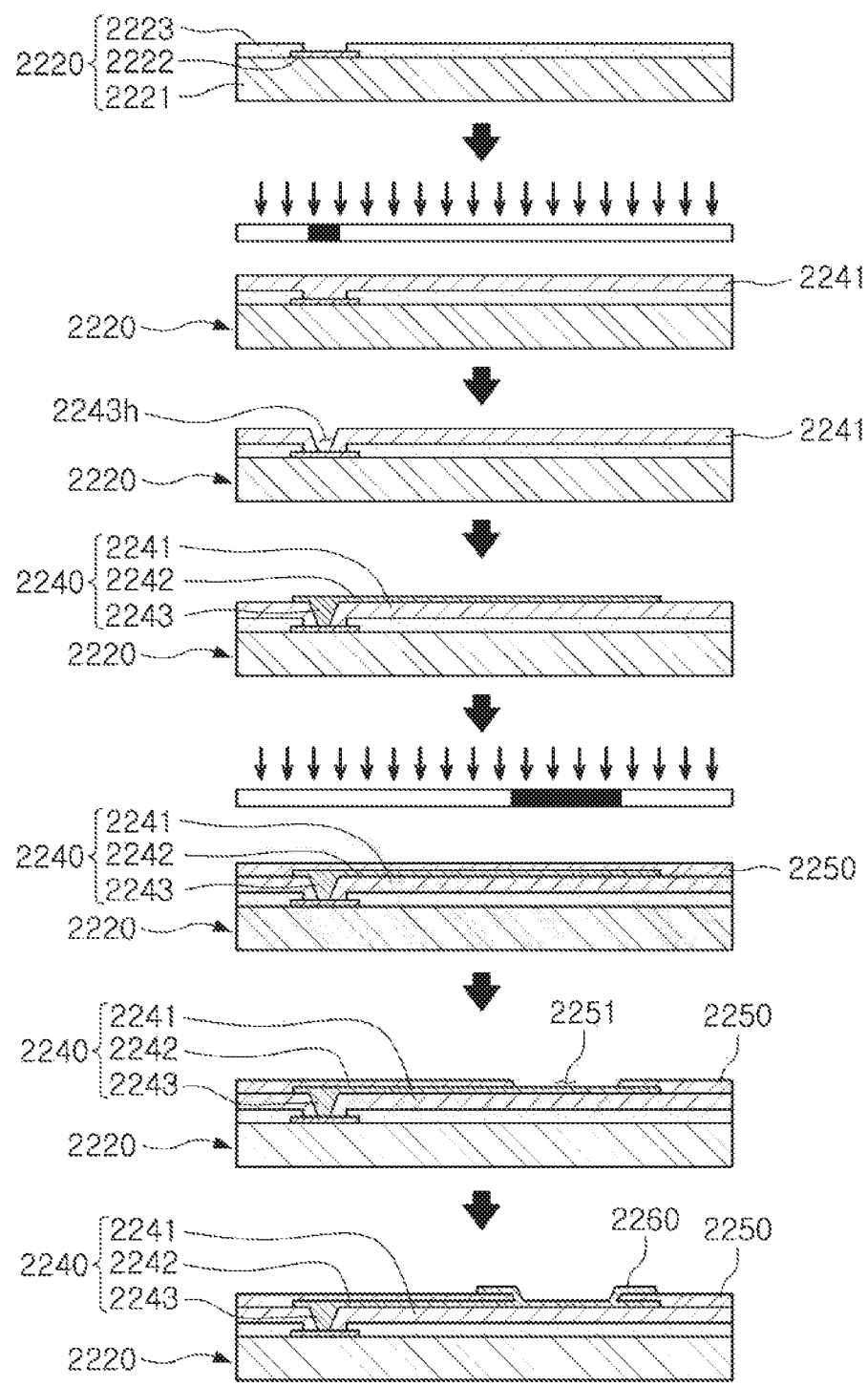
FIG. 21 is schematic cross-sectional views illustrating a packaging process of a fan-in semiconductor package.

FIG. 21 is schematic cross-sectional views illustrating a packaging process of a fan-in semiconductor package.

Referring to FIGS. 20A, 20B and 21, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it is difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the under-bump metal layer 2260 may be manufactured through a series of processes.

As described above, the fan-in semiconductor package may have a package form in which all of the connection pads, for example, input/output (I/O) terminals, of the semiconductor chip, are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even in a case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 22:
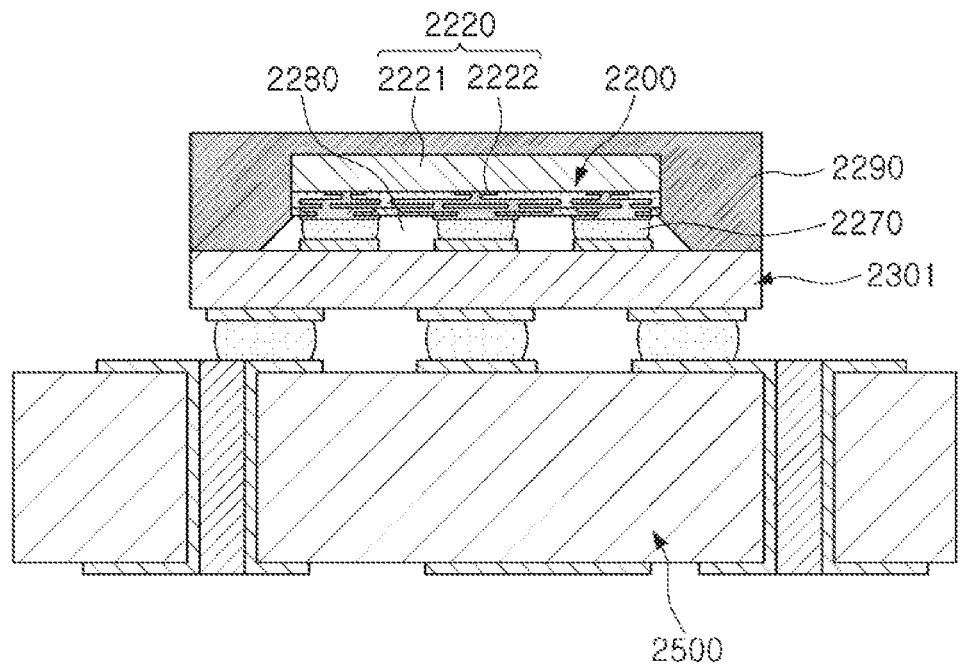
FIG. 22 is a schematic cross-sectional view illustrating a case in which a fan-in semiconductor package is mounted on an interposer substrate and is ultimately mounted on a main board of an electronic device.

FIG. 22 is a schematic cross-sectional view illustrating a case in which a fan-in semiconductor package is mounted on an interposer substrate and is ultimately mounted on a mainboard of an electronic device.

Figure 23:
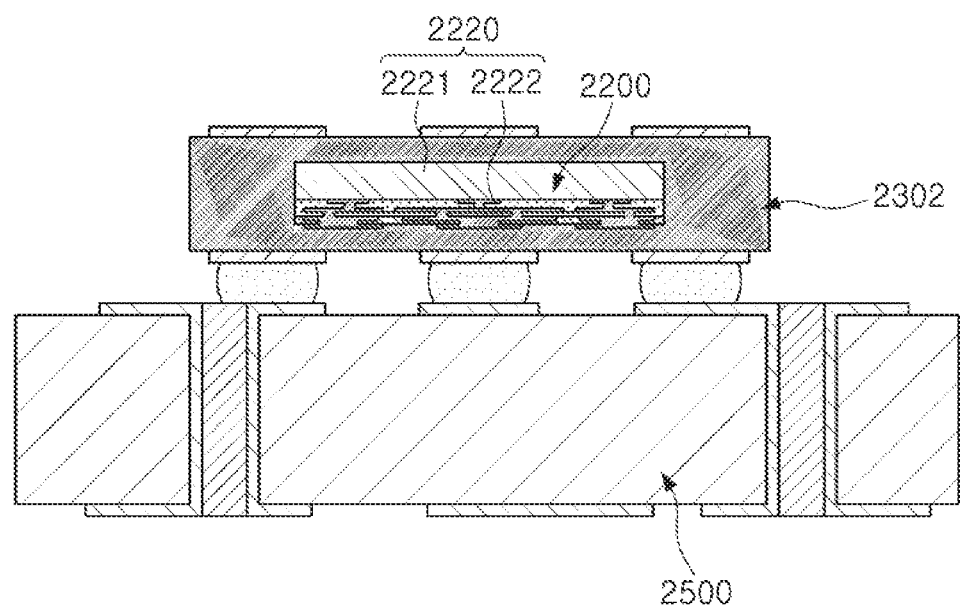
FIG. 23 is a schematic cross-sectional view illustrating a case in which a fan-in semiconductor package is embedded in an interposer substrate and is ultimately mounted on a main board of an electronic device.

FIG. 23 is a schematic cross-sectional view illustrating a case in which a fan-in semiconductor package is embedded in an interposer substrate and is ultimately mounted on a mainboard of an electronic device.

Referring to FIGS. 22 and 23, in a fan-in semiconductor package 2200, connection pads 2222, that is, I/O terminals, of a semiconductor chip 2220 may be redistributed through an interposer substrate 2301, and the fan-in semiconductor package 2200 may be ultimately mounted on a mainboard 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Figure 24:
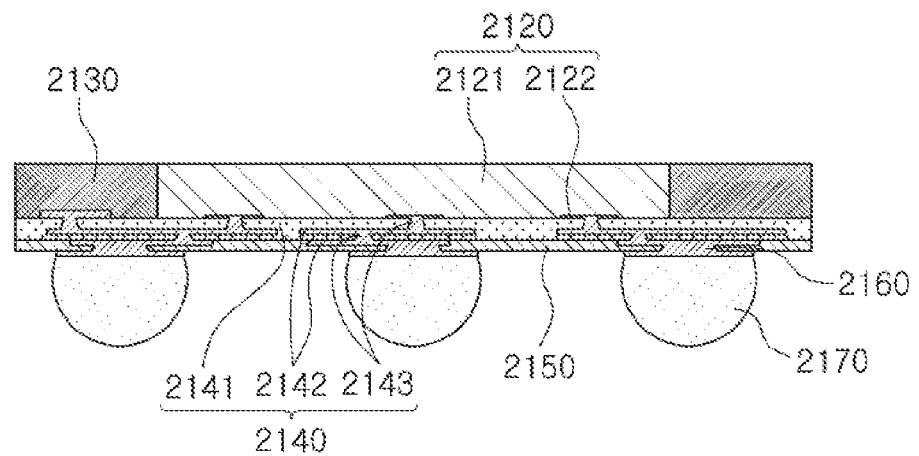
FIG. 24 is a schematic cross-sectional view illustrating a fan-out semiconductor package.

FIG. 24 is a schematic cross-sectional view illustrating a fan-out semiconductor package.

Referring to FIG. 24, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may be further formed on the connection member 2140, and an underbump metal layer 2160 may be further formed in openings of the passivation layer 2150. Solder balls 2170 may be further formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case that a size of the semiconductor chip is decreased, a standardized ball layout may be used in the fan-out semiconductor package as it is, such that the fan-out semiconductor package may be mounted on the mainboard of the electronic device without using a separate interposer substrate, as described below.

Figure 25:
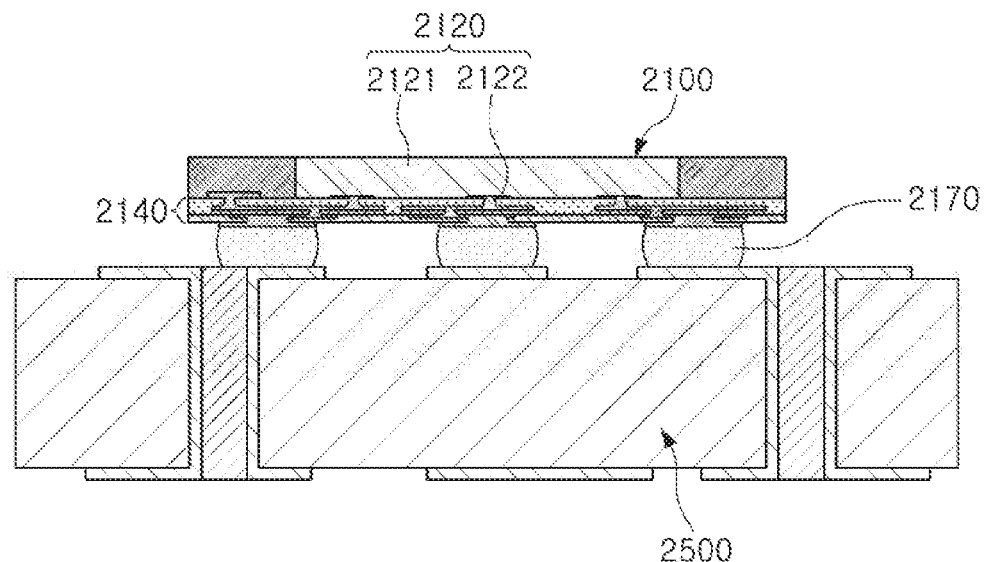
FIG. 25 is a schematic cross-sectional view illustrating a case in which a fan-out semiconductor package is mounted on a main board of an electronic device.

FIG. 25 is a schematic cross-sectional view illustrating a case in which a fan-out semiconductor package is mounted on a mainboard of an electronic device.

Referring to FIG. 25, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

As set forth above, according to the exemplary embodiments in the present disclosure, the antenna module may improve transmission and reception performance of a radio frequency (RF) signal in a first direction, be easily miniaturized, and improve the transmission and reception performance of the RF signal in a second direction by using an antenna package providing an environment capable of easily securing antenna performance.

While exemplary embodiments have been shown and described above, it will be apparent to those skilled in the art that modifications and variations could be made without departing from the scope of the present invention as defined by the appended claims.

What is claimed is:

1. An antenna module comprising:
    a fan-out semiconductor package including an integrated circuit (IC), an encapsulant encapsulating at least a portion of the IC, a core member having a first side surface facing the IC or the encapsulant, and a connection member including at least one wiring layer electrically connected to the IC and the core member and at least one insulating layer; and
    an antenna package including a plurality of first directional antenna members configured to transmit or receive a first radio frequency (RF) signal, a plurality of feed vias each having one end electrically connected to one of the plurality of first directional antenna members and the other end electrically connected to a corresponding wire of the at least one wiring layer, and a dielectric layer having a thickness greater than that of the at least one insulating layer,
    wherein the fan-out semiconductor package further includes at least one second directional antenna member disposed on a second side surface of the core member opposing the first surface of the core member, stood up to extend in a direction toward the fan-out semiconductor package from a position electrically connected to the at least one wiring layer, and configured to transmit or receive a second RF signal.

2. The antenna module of claim 1, wherein the at least one second directional antenna member further extends in a direction opposite to the direction toward the fan-out semiconductor package from the position electrically connected to the at least one wiring layer.

3. The antenna module of claim 1, wherein the fan-out semiconductor package further includes an encapsulation member, and
    the at least one second directional antenna member is in contact with the encapsulation member and is disposed between the encapsulation member and the core member.

4. The antenna module of claim 1, wherein the fan-out semiconductor package further includes:
    a core plating member disposed on the first side surface of the core member; and
    a connection pad disposed on one surface of the IC and electrically connecting the at least one wiring layer to the IC.

5. The antenna module of claim 4, wherein the core member includes a core dielectric layer in contact with the connection member, a first core wiring layer in contact with the connection member and embedded in the core dielectric layer, a second core wiring layer opposing the first core wiring layer of the core dielectric layer, and at least one core via penetrating through the core dielectric layer, electrically connecting the first and second core wiring layers to each other, and electrically connected to the connection pad, and
    the at least one second directional antenna member has a form in which a portion of at least one core via and a portion of the core plating member are bonded to each other.

6. The antenna module of claim 1, wherein the fan-out semiconductor package further includes a passive component electrically connected to the corresponding wire of the at least one wiring layer, and
    the passive component is disposed in an accommodation space in the core member.

7. The antenna module of claim 1, wherein the fan-out semiconductor package further includes a power management (PM) IC (PMIC) disposed between the core member and the IC and supplying power to the IC through the corresponding wire of the at least one wiring layer, and
    the IC generates the first and second RF signals.

8. The antenna module of claim 1, wherein the IC receives a base signal from the core member and converts the base signal into the first and second RF signals of a millimeter wave (mmWave) band.

9. The antenna module of claim 1, wherein the antenna package includes:
    a ground pattern in contact with the connection member; and
    a plurality of plating members each surrounding a corresponding feed via of the plurality of feed vias.

10. An antenna module comprising:
    an integrated circuit (IC);
    a wiring package including at least one wiring layer electrically connected to the IC, and at least one insulating layer; and
    an antenna package including a plurality of first directional antenna members configured to transmit or receive a first radio frequency (RF) signal, a plurality of feed vias each including one end electrically connected to one of the plurality of first directional antenna members and the other end electrically connected to a corresponding wire of the at least one wiring layer, and a dielectric layer having a thickness greater than that of the at least one insulating layer,
    wherein the antenna package further includes at least one second directional antenna member stood up to extend in a direction toward the antenna package from a corresponding position of the at least one wiring layer and configured to transmit or receive a second RF signal.

11. The antenna module of claim 10, wherein the antenna package further includes:
    a first encapsulation member disposed on the plurality of first directional antenna members; and
    a second encapsulation member in contact with the at least one second directional antenna member.

12. The antenna module of claim 11, wherein the antenna package further includes a plurality of first directional director members in contact with the first encapsulation member and configured to transmit or receive the first RF signal together with the plurality of first directional antenna members.

13. The antenna module of claim 10, wherein the antenna package further includes at least one second directional director member stood up to extend in a direction toward the antenna package from a corresponding position of the at least one wiring layer and configured to transmit or receive the second RF signal together with the at least one second directional antenna member.

14. The antenna module of claim 10, wherein one side surface of the at least one second directional antenna member uneven, and the other side surface of the at least one second directional antenna member is flat.

15. The antenna module of claim 10, wherein the antenna package includes:

a ground pattern in contact with the wiring package; and a plurality of plating member each surrounding a corresponding feed via of the plurality of feed vias and disposed to block the corresponding feed via and the at least one second directional antenna member.

16. The antenna module of claim 10, further comprising a core member including at least one core via electrically connected to the corresponding wire of the at least one wiring layer, the IC receives a base signal through the at least one core via and converts the base signal into the first and second RF signals of a millimeter wave (mmWave) band.

17. An antenna module comprising:

a connection member including a wiring layer and an insulating layer;

an antenna package stacking over a first surface of the connection member, and including a plurality of first directional antenna members configured to transmit or receive a first radio frequency (RF) signal, a plurality of feed vias each having one end electrically connected to one of the plurality of first directional antenna members and the other end electrically connected to a corresponding wire of the wiring layer, and a dielectric layer having a thickness greater than that of the insulating layer; and a second directional antenna member configured to transmit or receive a second RF signal, electrically connected to the wiring layer, and extending along a stacking direction of the antenna package and the connection member.

18. The antenna module of claim 17, further comprising a semiconductor package disposed on a second surface of the connection member opposing the first surface of the connection member, and including a core member having an accommodation space, an integrated circuit (IC) disposed in the accommodation space of the core member, an encapsulant encapsulating at least a portion of the IC, and the second directional antenna member being in contact with the core member.

19. The antenna module of claim 18, wherein the second directional antenna member extends from the semiconductor package to the antenna package through the connection member.

20. The antenna module of claim 17, wherein the second directional antenna member extends from the connection member to the antenna package.

\* \* \* \* \*